US011688731B2

(12) United States Patent
Chang et al.

(10) Patent No.: US 11,688,731 B2
(45) Date of Patent: Jun. 27, 2023

(54) INTEGRATED CIRCUIT DEVICE AND METHOD

(71) Applicant: TAIWAN SEMICONDUCTOR MANUFACTURING COMPANY, LTD., Hsinchu (TW)

(72) Inventors: Yi-Jui Chang, Hsinchu (TW); Jung-Chan Yang, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 9 days.

(21) Appl. No.: 17/231,206

(22) Filed: Apr. 15, 2021

(65) Prior Publication Data

US 2022/0246599 A1 Aug. 4, 2022

Related U.S. Application Data

(60) Provisional application No. 63/143,557, filed on Jan. 29, 2021.

(51) Int. Cl.
*H01L 27/02* (2006.01)
*H01L 27/092* (2006.01)
(Continued)

(52) U.S. Cl.
CPC .. *H01L 27/0207* (2013.01); *H01L 21/823821* (2013.01); *H01L 21/823871* (2013.01);
(Continued)

(58) Field of Classification Search
CPC .......... H01L 27/0924; H01L 21/76813; H01L 21/76816; H01L 27/0207
See application file for complete search history.

(56) References Cited

U.S. PATENT DOCUMENTS 7,260,442 B2    8/2007  Hwang et al.
9,256,709 B2    2/2016  Yu et al.
(Continued)

FOREIGN PATENT DOCUMENTS

DE    102018101652    1/2019
JP    S61063039       1/1986
(Continued)

OTHER PUBLICATIONS

Office Action dated Jun. 30, 2022 for corresponding case No. KR 10-2021-0076791. (pp. 1-4).
(Continued)

*Primary Examiner* — Changhyun Y
(74) *Attorney, Agent, or Firm* — Hauptman Ham, LLP

(57) ABSTRACT

An integrated circuit (IC) device includes a functional circuit electrically coupled to a first power supply node and operable by a first power supply voltage on the first power supply node, and a power control circuit including a first transistor and a second transistor of different types. The first transistor includes a gate terminal configured to receive a control signal, a first terminal electrically coupled to the first power supply node, and a second terminal electrically coupled to a second power supply node. The second transistor includes a gate terminal configured to receive the control signal, and first and second terminals configured to receive a predetermined voltage. The first transistor is configured to, in response to the control signal, connect or disconnect the first and second power supply nodes to provide or cutoff power supply to the functional circuit.

20 Claims, 29 Drawing Sheets

(51) Int. Cl.
  *H01L 21/8238* (2006.01)
  *H01L 29/78* (2006.01)
  *H01L 29/423* (2006.01)
  *H01L 29/66* (2006.01)
  *H01L 29/786* (2006.01)
  *H01L 29/06* (2006.01)

(52) U.S. Cl.
  CPC ...... *H01L 27/0924* (2013.01); *H01L 29/0673* (2013.01); *H01L 29/42392* (2013.01); *H01L 29/66469* (2013.01); *H01L 29/66742* (2013.01); *H01L 29/66795* (2013.01); *H01L 29/785* (2013.01); *H01L 29/78645* (2013.01)

(56) References Cited

U.S. PATENT DOCUMENTS

| | | |
|---|---|---|
| 2006/0261855 A1 | 11/2006 | Hillman et al. |
| 2007/0120578 A1 | 5/2007 | Mair et al. |
| 2014/0040838 A1 | 2/2014 | Liu et al. |
| 2015/0278429 A1 | 10/2015 | Chang |
| 2015/0380325 A1 | 12/2015 | Kindereit et al. |
| 2018/0151567 A1 | 5/2018 | Lin et al. |
| 2019/0013314 A1 | 1/2019 | Choi et al. |
| 2019/0304900 A1 | 10/2019 | Chen et al. |
| 2020/0075595 A1* | 3/2020 | Shin ................. H01L 21/76883 |

FOREIGN PATENT DOCUMENTS

| | | |
|---|---|---|
| JP | 2011120158 | 6/2011 |
| KR | 1020190032145 | 3/2019 |
| KR | 1020200008529 | 1/2020 |
| KR | 1020200043943 | 4/2020 |
| KR | 20200123399 | 10/2020 |
| TW | 201639099 | 11/2016 |
| TW | 202013744 | 4/2020 |
| WO | 2020110733 | 6/2020 |

OTHER PUBLICATIONS

Office Action dated Oct. 2, 2021 for corresponding case No. DE 10 2021 110 387.8 (p. 1).

Notice of Allowance dated Apr. 24, 2023 from corresponding application No. KR 10-2021-0076781, pp. 1-8.

* cited by examiner

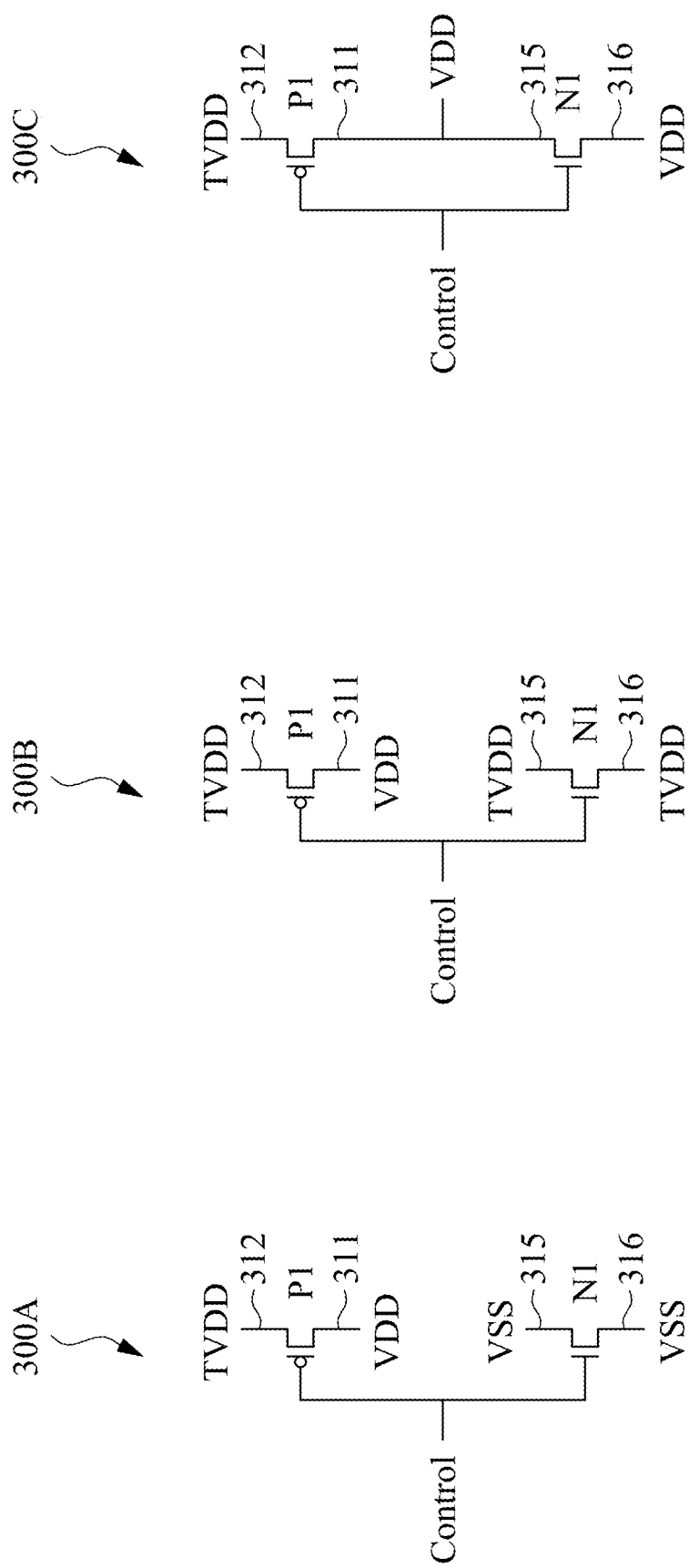

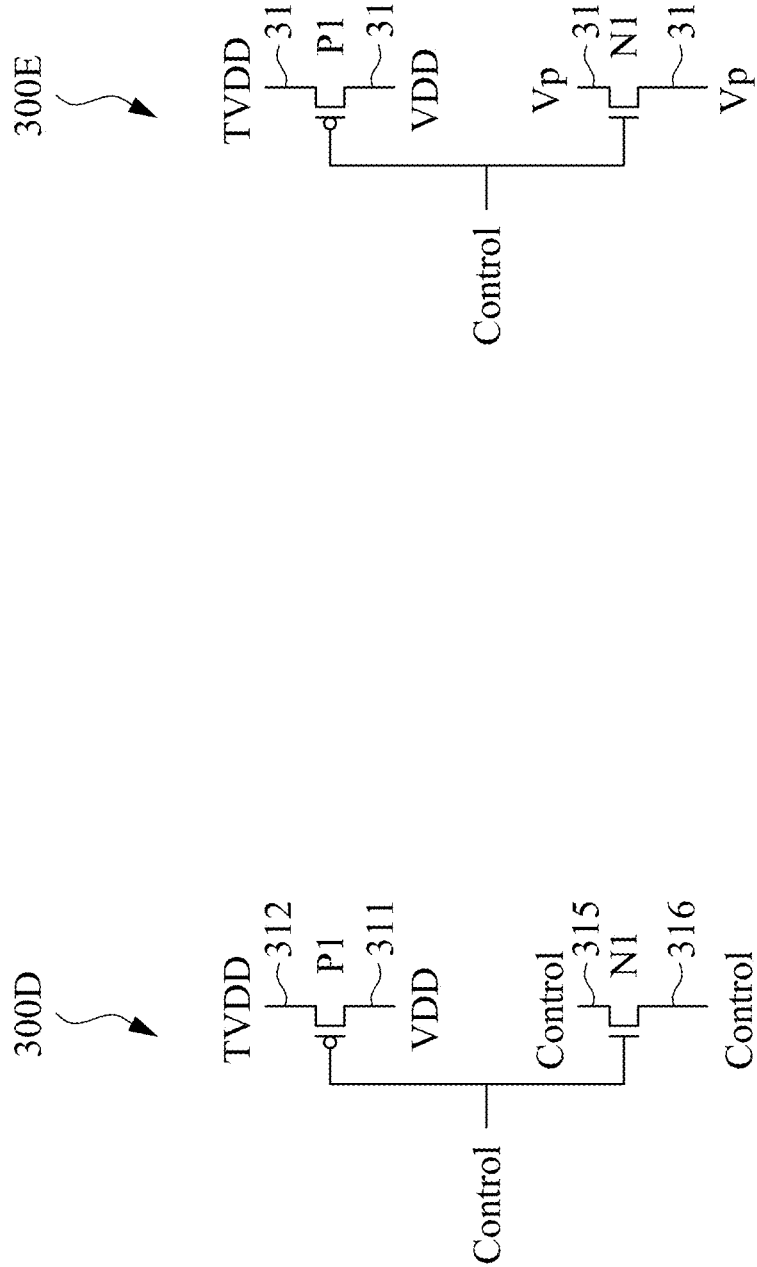

| Cell Height | Single | Double | Triple | |
|---|---|---|---|---|
| OD Width | D | D,E | D,E,F | |
| Configuration | D | DE (DE,ED) <br> 2D (DD) | DEF (DEF,DFE,EDF,EFD,FDE,FED) <br> 2DE (DDE,DED,EDD) <br> 3D (DDD) | |

Fig. 7B

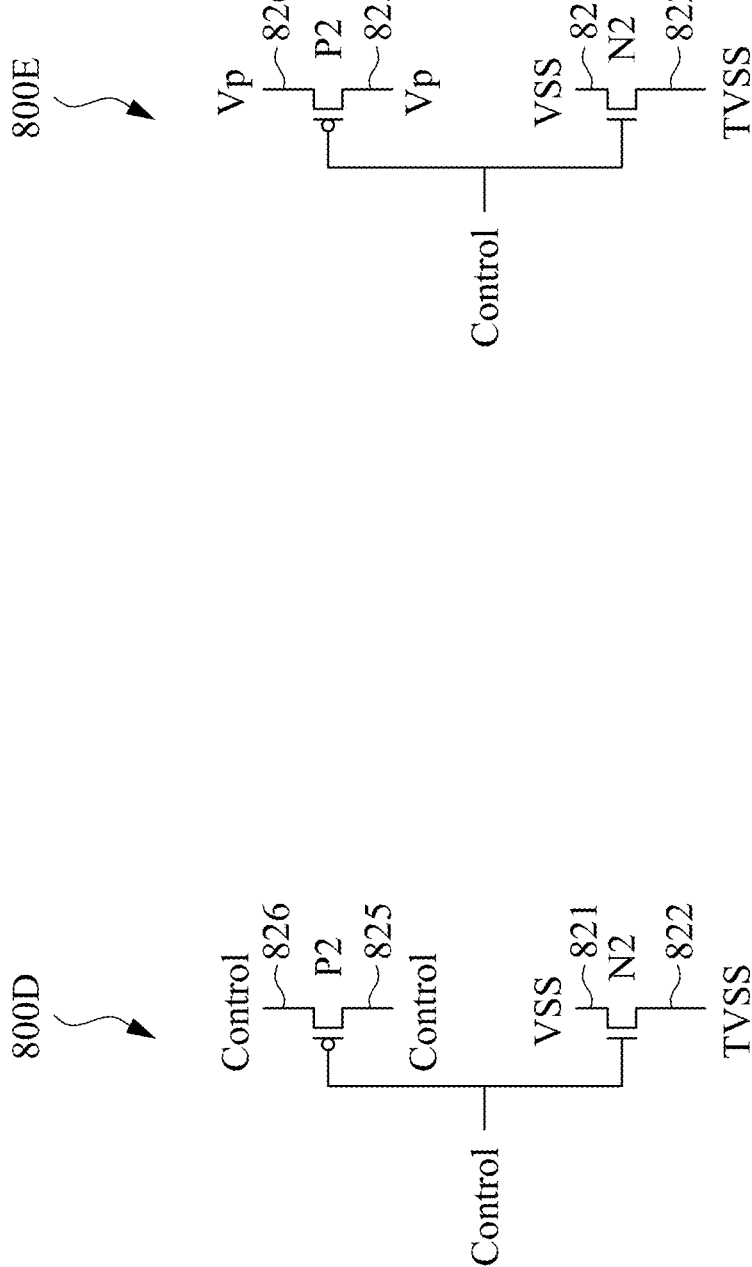

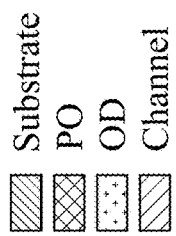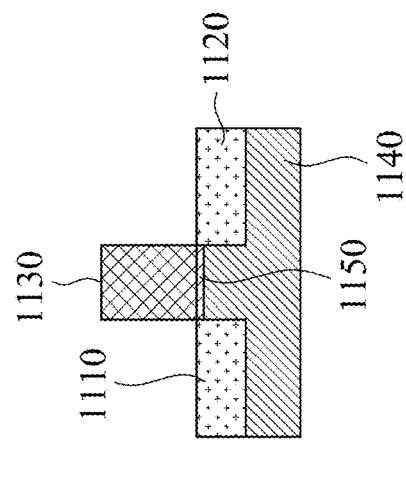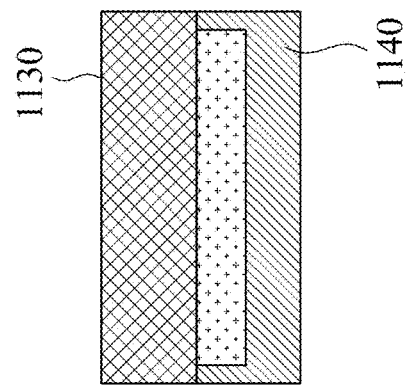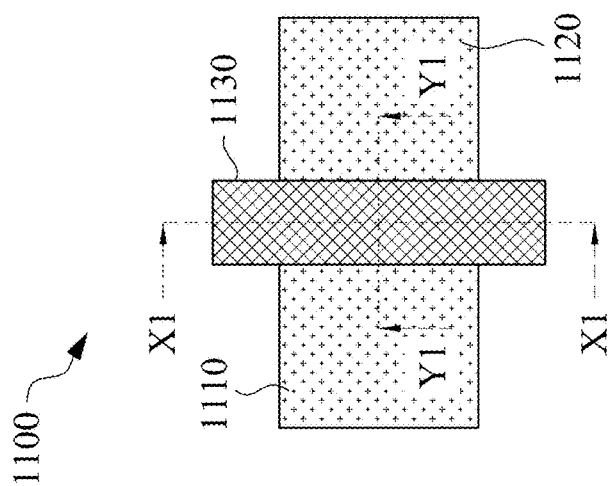

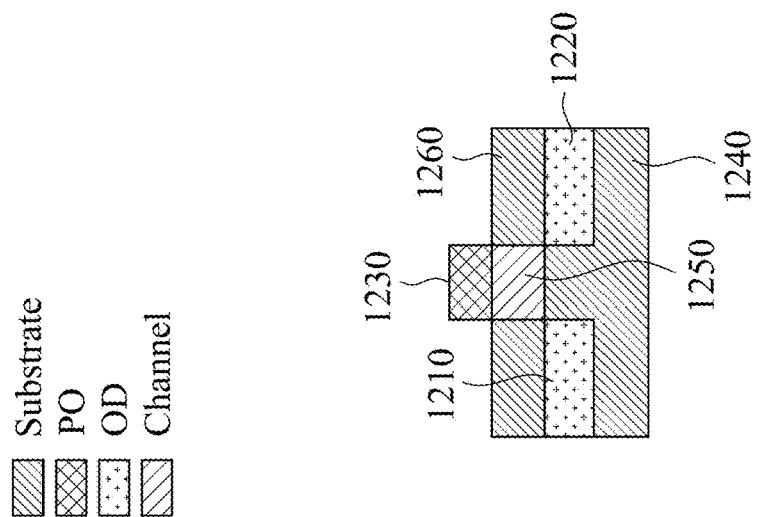
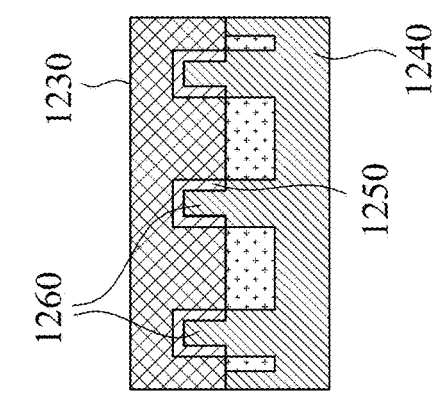
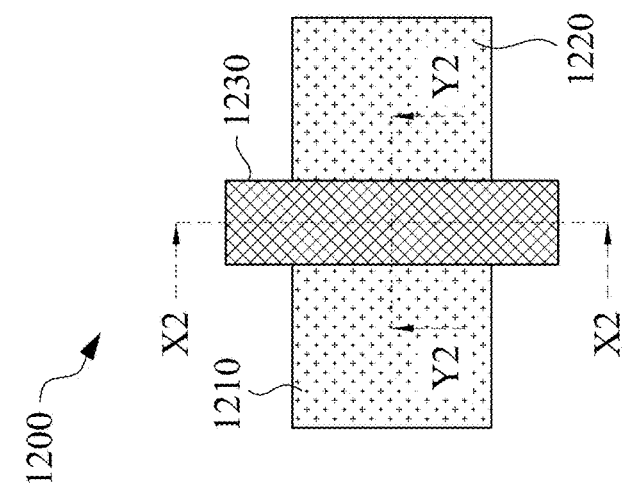
Fig. 12C
Fig. 12B
Fig. 12A

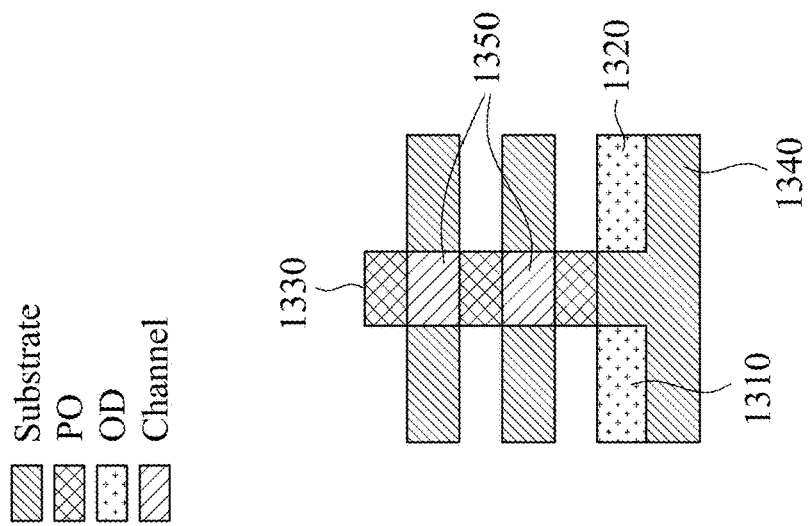
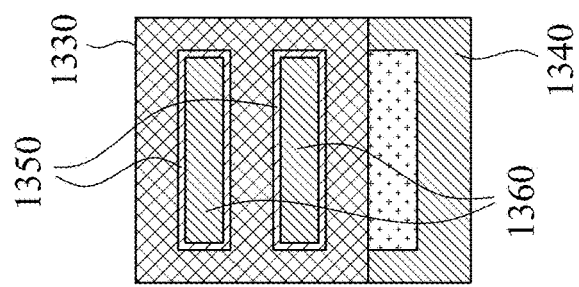
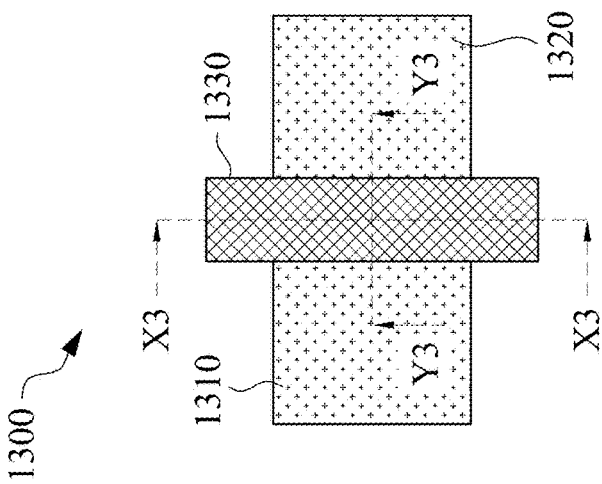
Fig. 13C
Fig. 13B
Fig. 13A

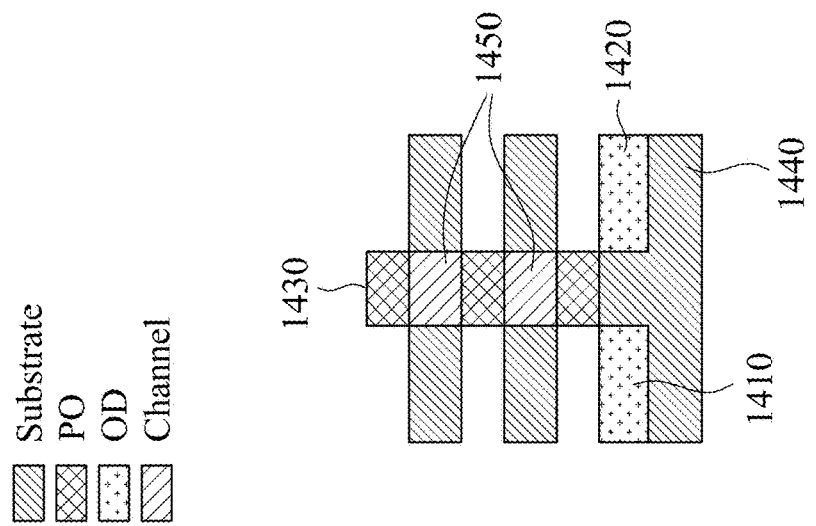
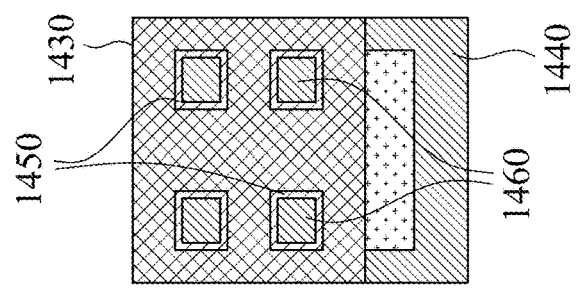
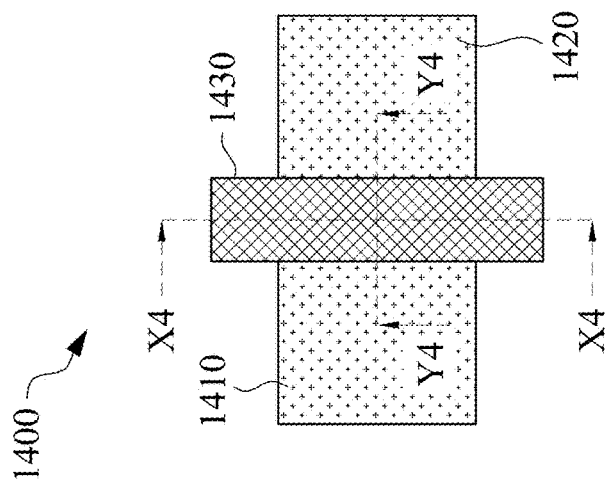
Fig. 14C
Fig. 14B
Fig. 14A

INTEGRATED CIRCUIT DEVICE AND METHOD

RELATED APPLICATION(S)

The instant application claims the benefit of U.S. Provisional Application No. 63/143,557, filed Jan. 29, 2021, the entirety of which is incorporated by reference herein.

BACKGROUND

An integrated circuit ("IC") device or semiconductor device includes one or more devices represented in an IC layout diagram (also referred to as a "layout diagram"). A layout diagram is hierarchical and includes modules which carry out higher-level functions in accordance with the IC design specifications. The modules are often built from a combination of cells, each of which represents one or more semiconductor structures configured to perform a specific function. Cells having pre-designed layout diagrams, sometimes known as standard cells, are stored in standard cell libraries (hereinafter "libraries" or "cell libraries" for simplicity) and accessible by various tools, such as electronic design automation (EDA) tools, to generate, optimize and verify designs for ICs.

Minimization of power consumption of a semiconductor device is a design consideration. An approach involves including a header circuit (also referred to as "header switch") and/or a footer circuit (also referred to as "footer switch") between a power supply node (or rail) and a functional circuit. The power consumption is reduced by turning OFF the header switch and/or the footer switch when the functional circuit is in a non-active state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3E are schematic circuit diagrams of various header circuits, in accordance with some embodiments.

FIGS. 7A-7B are tables schematically showing various layout diagram configurations with different cell heights, in accordance with some embodiments.

FIGS. 8A-8E are schematic circuit diagrams of various footer circuits, in accordance with some embodiments.

FIG. 11A is a schematic top plan view of a planar transistor, FIG. 11B is a schematic cross-section view of the planar transistor along line X1-X1 in FIG. 11A, and FIG. 11C is a schematic cross-section view of the planar transistor along line Y1-Y1 in FIG. 11A, in accordance with some embodiments.

FIG. 12A is a schematic top plan view of a fin field-effect transistor (FINFET), FIG. 12B is a schematic cross-section view of the FINFET along line X2-X2 in FIG. 12A, and FIG. 12C is a schematic cross-section view of the FINFET along line Y2-Y2 in FIG. 12A, in accordance with some embodiments.

FIG. 13A is a schematic top plan view of a nanosheet FET, FIG. 13B is a schematic cross-section view of the nanosheet FET along line X3-X3 in FIG. 13A, and FIG. 13C is a schematic cross-section view of the nanosheet FET along line Y3-Y3 in FIG. 13A, in accordance with some embodiments.

FIG. 14A is a schematic top plan view of a nanowire FET, FIG. 14B is a schematic cross-section view of the nanowire FET along line X4-X4 in FIG. 14A, and FIG. 14C is a schematic cross-section view of the nanowire FET along line Y4-Y4 in FIG. 14A, in accordance with some embodiments.

DETAILED DESCRIPTION

Figure 1:
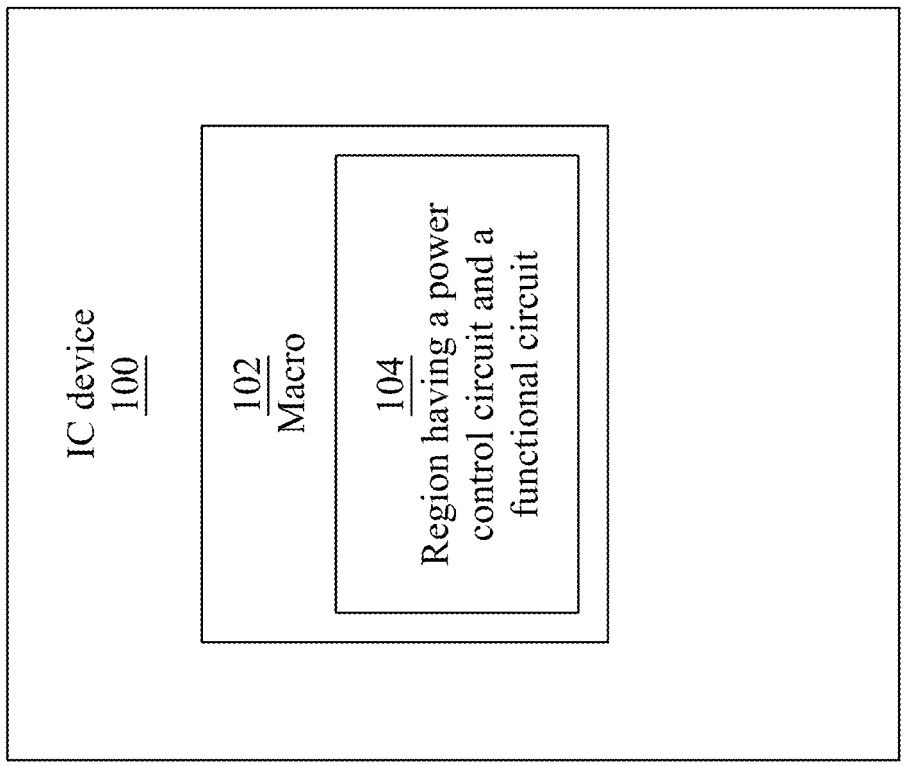
FIG. 1 is a block diagram of an IC device, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A header circuit or footer circuit comprises a first transistor, and a second transistor of a type different from that of the first transistor. For example, when the first transistor is a p-channel metal-oxide semiconductor (PMOS) transistor, the second transistor is an n-channel metal-oxide semiconductor (NMOS), or vice versa. In some embodiments, the first transistor is configured to controllably provide or cutoff power supply to a functional circuit, and the second transistor is electrically coupled into a dummy transistor. In at least one embodiment, the electrical coupling of the second transistor into a dummy transistor permits an electric connection for the first transistor to be arranged toward the second, dummy transistor, which frees up routing resources over the first transistor. In one or more embodiments, the freed up routing resources are usable to provide one or more additional electrical connections for the first transistor. As a result, the header circuit or footer circuit in accordance with some embodiments has one or more advantages, such as, an increased power current density, a reduced ON resistance ($R_{ON}$), a reduced area, or the like, compared to other approaches where the second transistor remains unused.

FIG. 1 is a block diagram of an IC device 100, in accordance with some embodiments.

In FIG. 1, the IC device 100 comprises, among other things, a macro 102. In some embodiments, the macro 102 comprises one or more of a memory, a power grid, a cell or cells, an inverter, a latch, a buffer and/or any other type of circuit arrangement that may be represented digitally in a cell library. In some embodiments, the macro 102 is understood in the context of an analogy to the architectural hierarchy of modular programming in which subroutines/procedures are called by a main program (or by other subroutines) to carry out a given computational function. In this context, the IC device 100 uses the macro 102 to perform one or more given functions. Accordingly, in this context and in terms of architectural hierarchy, the IC device 100 is analogous to the main program and the macro 102 is analogous to subroutines/procedures. In some embodiments, the macro 102 is a soft macro. In some embodiments, the macro 102 is a hard macro. In some embodiments, the macro 102 is a soft macro which is described digitally in register-transfer level (RTL) code. In some embodiments, synthesis, placement and routing have yet to have been performed on the macro 102 such that the soft macro can be synthesized, placed and routed for a variety of process nodes. In some embodiments, the macro 102 is a hard macro which is described digitally in a binary file format (e.g., Graphic Database System II (GDSII) stream format), where the binary file format represents planar geometric shapes, text labels, other information and the like of one or more layout-diagrams of the macro 102 in hierarchical form. In some embodiments, synthesis, placement and routing have been performed on the macro 102 such that the hard macro is specific to a particular process node.

The macro 102 includes a region 104 which comprises a functional circuit, and a power control circuit as described herein. In some embodiments, the region 104 comprises a substrate having circuitry formed thereon, in a front-end-of-line (FEOL) fabrication. Furthermore, above and/or below the substrate, the region 104 comprises various metal layers that are stacked over and/or under insulating layers in a Back End of Line (BEOL) fabrication. The BEOL provides routing for circuitry of the IC device 100, including the macro 102 and the region 104.

Figure 2:
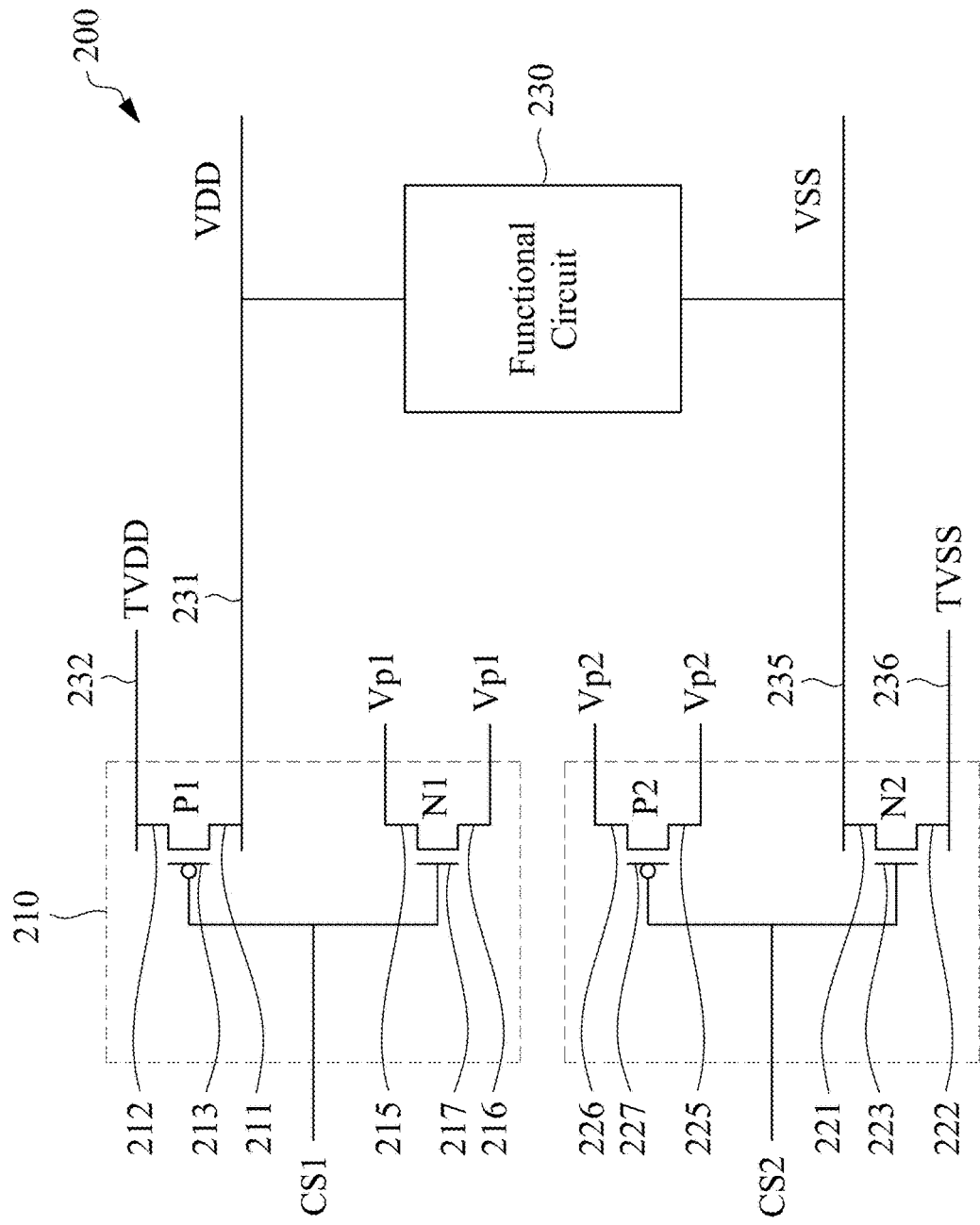
FIG. 2 is a schematic block diagram of a circuit region of an IC device, in accordance with some embodiments.

FIG. 2 is a schematic block diagram of a circuit region of an IC device 200, in accordance with some embodiments. In at least one embodiment, the circuit region in FIG. 2 corresponds to a portion of the region 104 in FIG. 1.

The IC device 200 comprises a power control circuit which comprises a header circuit 210 and a footer circuit 220. In at least one embodiment, either the header circuit 210 or the footer circuit 220 is omitted. The IC device 200 further comprises a functional circuit 230 operable by a power supply voltage from at least one of the header circuit 210 or the footer circuit 220, as described herein.

The header circuit 210 comprises a first transistor P1 and a second transistor N1 of different types. The footer circuit 220 comprises a first transistor N2 and a second transistor P2 of different types. In the example configuration in FIG. 2, the transistors P1, P2 are P-type transistors, and the transistors N1, N2 are N-type transistors. Examples of transistors in the header circuit 210 and/or the footer circuit 220 include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. In some embodiments, a PMOS transistor is referred to as a transistor of a first or second type, and an NMOS transistor is referred to as a transistor of the second or first type.

In the header circuit 210, the first transistor P1 comprises a first terminal 211 electrically coupled to a first power supply node or rail 231, a second terminal 212 electrically coupled to a second power supply node or rail 232, and a gate terminal 213 configured to receive a control signal CS1. The second transistor N1 comprises first and second terminals 215, 216 configured to receive a predetermined voltage Vp1, and a gate terminal 217 configured to receive the control signal CS1. In some embodiments, the first terminal of a transistor is a source or a drain of the transistor, and the second terminal of the transistor is the drain or the source of the transistor. The first and second terminals of a transistor are sometimes referred to as source/drains of the transistor.

The transistor P1 is configured to, in response to the control signal CS1, connect or disconnect the power supply nodes 231, 232, to provide or cutoff power supply to the functional circuit 230. The transistor P1 is sometimes referred to as a switch transistor. The power supply node 232 is configured to receive a power supply voltage True VDD (herein "TVDD"). The power supply node 232 is referred to herein as "TVDD power rail." In some embodiments, TVDD is generated by an external voltage supply outside the IC device 200. In some embodiments, TVDD is generated by an internal voltage supply included in the IC device 200. When the transistor P1 is turned ON by a first logic level, e.g., logic "0," of the control signal CS1, TVDD on the TVDD power rail 232, which is connected by the transistor P1 to the power supply node 231, provides a power supply voltage VDD (herein "VDD") on the power supply node 231. The first power supply node 231 is referred to herein as "VDD power rail." VDD is sometimes referred to as virtual VDD (VVDD). In some embodiments, TVDD is different from VDD. In some embodiments, TVDD is the same as VDD. When the transistor P1 is turned OFF by a second logic level, e.g., logic "1," of the control signal CS1, the VDD power rail 231 is disconnected from the TVDD power rail 232, and power supply to the functional circuit 230 is cutoff. In some embodiments, the VDD power rail 231 is floating when the transistor P1 is turned OFF. In some embodiments, the control signal CS1 is generated by an external circuit outside the IC device 200. In some embodiments, the control signal CS1 is generated by a power management circuit included in the IC device 200.

Because the first and second terminals 215, 216 of the transistor N1 are configured to receive the same predetermined voltage Vp1, the terminals 215, 216 of the transistor N1 are effectively electrically coupled together and the transistor N1 is electrically coupled as a dummy transistor. In some embodiments, the predetermined voltage Vp1 applied to the first and second terminals 215, 216 of the transistor N1 is a power voltage, a control signal, or any predetermined voltage or signal other than power voltages and the control signal, as described herein.

In the footer circuit 220, the first transistor N2 comprises a first terminal 221 electrically coupled to a first power supply node or rail 235, a second terminal 222 electrically coupled to a second power supply node or rail 236, and a gate terminal 223 configured to receive a control signal CS2. The second transistor P2 comprises first and second terminals 225, 226 electrically coupled together and configured to receive a predetermined voltage Vp2, and a gate terminal 227 configured to receive the control signal CS2.

The transistor N2 is configured to, in response to the control signal CS2, connect or disconnect the power supply nodes 235, 236, to provide or cutoff power supply to the functional circuit 230. The transistor N2 is sometimes referred to as a switch transistor. The power supply node 236 is configured to receive a power supply voltage True VSS (herein "TVSS"). The second power supply node 236 is referred to herein as "TVSS power rail." In some embodiments, TVSS is the ground voltage. In some embodiments, TVSS is a reference voltage other than the ground voltage. In at least one embodiment, the reference voltage other than the ground voltage is generated by an external circuit outside the IC device 200, or by an internal voltage supply included in the IC device 200. When the transistor N2 is turned ON by a first logic level, e.g., logic "1," of the control signal CS2, TVSS on the TVSS power rail 236, which is connected by the transistor N2 to the power supply node 235, provides a power supply voltage VSS (herein "VSS") on the power supply node 235. The power supply node 235 is referred to herein as "VSS power rail." VSS is sometimes referred to as virtual VSS (VVSS). In some embodiments, TVSS is different from VSS. In some embodiments, TVSS is the same as VSS. When the transistor N2 is turned OFF by a second logic level, e.g., logic "0," of the control signal CS2, the VSS power rail 235 is disconnected from the TVSS power rail 236, and power supply to the functional circuit 230 is cutoff. In some embodiments, the VSS power rail 235 is floating when the transistor N2 is turned OFF. In some embodiments, the control signal CS2 is generated by an external circuit outside the IC device 200. In some embodiments, the control signal CS2 is generated by a power management circuit included in the IC device 200. In some embodiments, the control signal CS2 is the same as the control signal CS1. In at least one embodiment, the control signal CS2 is different from the control signal CS1.

Because the first and second terminals 225, 226 of the transistor P2 are configured to receive the same predetermined voltage Vp2, the terminals 225, 226 of the transistor P2 are effectively electrically coupled together and the transistor P2 is electrically coupled as a dummy transistor. In some embodiments, the predetermined voltage Vp2 applied to the first and second terminals 225, 226 of the transistor P2 is a power voltage, a control signal, or any predetermined voltage or signal other than power voltages and the control signal. In some embodiments, the predetermined voltage Vp2 is the same as the predetermined voltage Vp1. In at least one embodiment, the predetermined voltage Vp2 is different from the predetermined voltage Vp1.

The functional circuit 230 is configured to be operable by VDD and VSS correspondingly on the VDD power rail 231 and the VSS power rail 235, to perform one or more functions of the IC device 200. In at least one embodiment, when either VDD or VSS is removed from the corresponding VDD power rail 231 or VSS power rail 235 by switching OFF the corresponding header circuit 210 or footer circuit 220, the functional circuit 230 becomes inactive and stops performing the one or more functions. As a result, it is possible to reduce power consumption of the IC device 200 when one or more functions provided by the functional circuit 230 is/are not required. In some embodiments, the functional circuit 230 comprises one or more active devices, passive devices, logic circuits, or the like, configured to operate on VDD and VSS. Examples of logic circuits include, but are not limited to, AND, OR, NAND, NOR, XOR, INV, AND-OR-Invert (AOI), OR-AND-Invert (OAI), MUX, Flip-flop, BUFF, Latch, delay, clock, memory, or the like. Example memory cells include, but are not limited to, a static random access memory (SRAM), a dynamic RAM (DRAM), a resistive RAM (RRAIVI), a magnetoresistive RAM (MRAM), a read only memory (ROM), or the like. Examples of active devices or active elements include, but are not limited to, transistors, diodes, or the like. Examples of transistors include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. Examples of passive elements include, but are not limited to, capacitors, inductors, fuses, resistors, or the like.

In the example configuration in FIG. 2, the power control circuit includes both the header circuit 210 and footer circuit 220, and power supply to the functional circuit 230 is controlled, e.g., provided or cutoff, by at least one of the header circuit 210 or the footer circuit 220 in accordance with the corresponding control signal CS1 or control signal CS2.

In some embodiments, the power control circuit of the IC device 200 includes the header circuit 210, but the footer circuit 220 is omitted. In an example, the VSS power rail 235 is omitted, and the functional circuit 230 is electrically coupled to the TVSS power rail 236. In another example, the VSS power rail 235 is electrically coupled to the TVSS power rail 236 by a conductor, instead of a switch or a transistor. Power supply to the functional circuit 230 is controlled, e.g., provided or cutoff, by the header circuit 210 in accordance with the control signal CS1.

In some embodiments, the power control circuit of the IC device 200 includes the footer circuit 220, but the header circuit 210 is omitted. In an example, the VDD power rail 231 is omitted, and the functional circuit 230 is electrically coupled to the TVDD power rail 232. In another example, the VDD power rail 231 is electrically coupled to the TVSS power rail 236 by a conductor, instead of a switch or a transistor. Power supply to the functional circuit 230 is controlled, e.g., provided or cutoff, by the footer circuit 220 in accordance with the control signal CS2.

As described herein, the transistor N1 is electrically coupled into a dummy transistor by applying the same predetermined voltage Vp1 to the terminals 215, 216 of the transistor N1, and the transistor P2 is electrically coupled into a dummy transistor by applying the same predetermined voltage Vp2 to the terminals 225, 226 of the transistor P2. In some embodiments, the predetermined voltage Vp1 or Vp2 is a power supply voltage, a control signal, or a signal or voltage other than the control signal and the power supply voltage, as described with respect to FIGS. 3A-3E and 8A-8E.

FIGS. 3A-3E are schematic circuit diagrams of various header circuits 300A-300E, in accordance with some embodiments. In at least one embodiment, one or more of the header circuits 300A-300E correspond to the header circuit 210 in FIG. 2. Components in FIGS. 3A-3E having corresponding components in FIG. 2 are designated by the same reference numerals of FIG. 2 or by the reference numerals of FIG. 2 increased by 100.

In FIGS. 3A-3E, each of the header circuits 300A-300E comprises a first transistor P1 and a second transistor N1 as described with respect to FIG. 2. Specifically, gate terminals of the transistors P1, N1 are electrically coupled to receive a control signal Control corresponding to the control signal CS1 in FIG. 2. The transistor P1 is a switch transistor, and comprises a first terminal 311 electrically coupled to a VDD power rail, and a second terminal 322 electrically coupled to a TVDD power rail. The transistor N1 is electrically coupled as a dummy transistor, and comprises a first terminal 315 and a second terminal 316 electrically coupled to receive the same predetermined voltage.

The predetermined voltage on the terminals 315, 316 of the transistor N1 differs among the header circuits 300A-300E. In the header circuit 300A in FIG. 3A, the predetermined voltage on the terminals 315, 316 of the transistor N1 is VSS. In the header circuit 300B in FIG. 3B, the predetermined voltage on the terminals 315, 316 of the transistor N1 is TVDD. In the header circuit 300C in FIG. 3C, the predetermined voltage on the terminals 315, 316 of the transistor N1 is VDD. In the header circuit 300D in FIG. 3D, the predetermined voltage on the terminals 315, 316 of the transistor N1 is the control signal Control. In the header circuit 300E in FIG. 3E, the predetermined voltage on the terminals 315, 316 of the transistor N1 is Vp which is a voltage or signal other than power supply voltages VSS, TVDD and VDD, and control signal Control. As described herein, examples of the predetermined voltage on the terminals 315, 316 of the transistor N1 in accordance with some embodiments include a power supply voltage, such as VSS, TVDD, or VDD, a control signal, such as Control, or a voltage other than VSS, TVDD, VDD, and Control. Other voltage configurations are within the scopes of various embodiments.

Figure 4A:
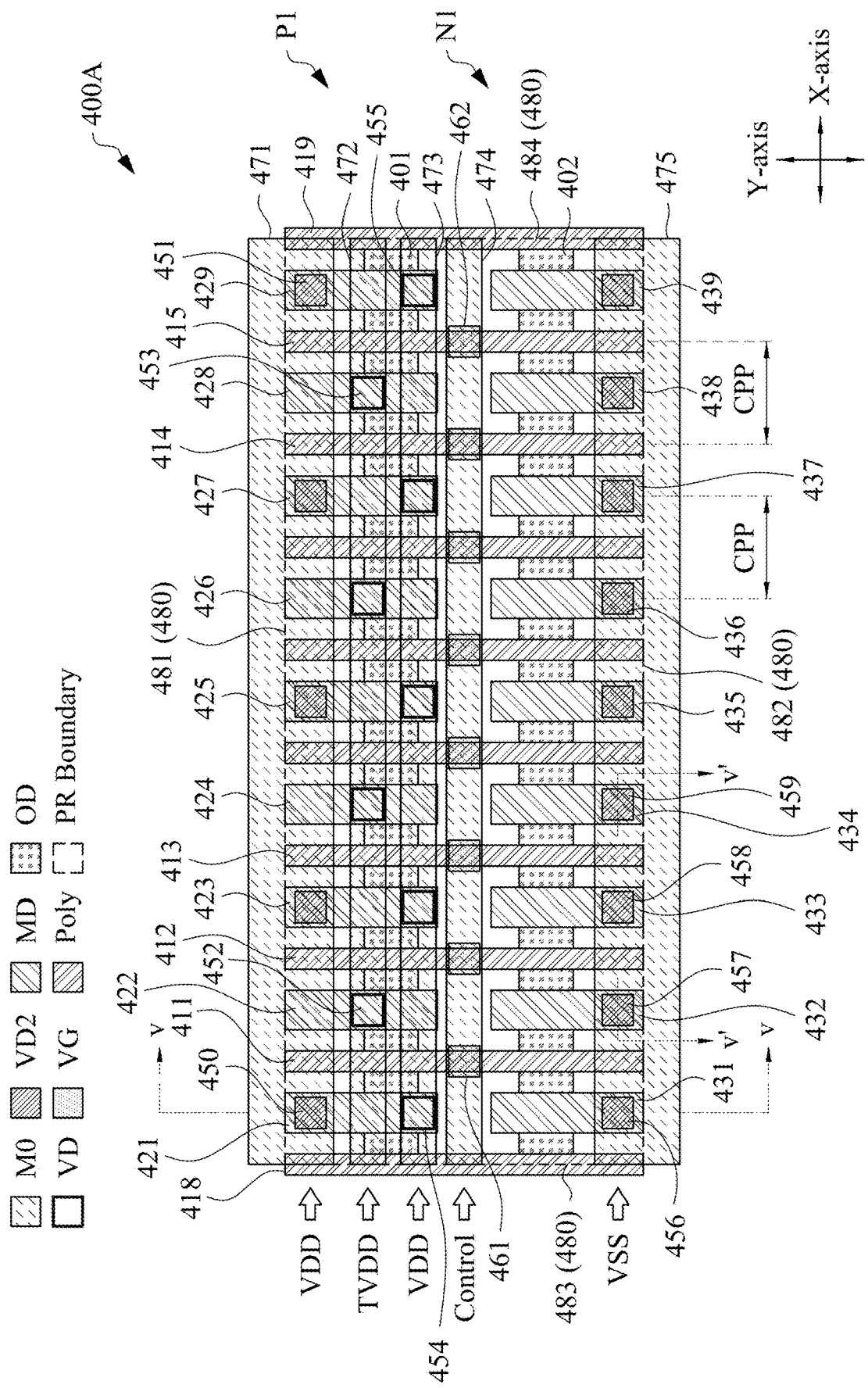
FIGS. 4A-4E are schematic views of layout diagrams of various header cells, in accordance with some embodiments.

FIG. 4A is a schematic view of a layout diagrams of a header cell 400A, in accordance with some embodiments. In at least one embodiment, the header cell 400A corresponds to the header circuit 300A. In at least one embodiment, the header cell 400A is stored as a standard cell in a standard cell library on a non-transitory computer-readable medium.

The header cell 400A comprises a plurality of active regions 401, 402. Active regions are sometimes referred to as oxide-definition (OD) regions or source/drain regions, and are schematically illustrated in the drawings with the label "OD." In at least one embodiment, the active regions 401, 402 are over a front side of a substrate as described herein. The active regions 401, 402 are elongated along a first axis, e.g., an X-axis. The active regions 401, 402 include P-type dopants and/or N-type dopants to form one or more circuit elements or devices. Examples of circuit elements include, but are not limited to, transistors and diodes. An active region configured to form one or more PMOS devices is sometimes referred to as "PMOS active region," and an active region configured to form one or more NMOS devices is sometimes referred to as "NMOS active region." In the example configuration described with respect to FIG. 4A, the active region 401 comprises a PMOS active region, and the active region 402 comprise an NMOS active region. Other configurations are within the scopes of various embodiments. In some embodiments, a PMOS active region is referred to as an active region of a first or second semiconductor type, and an NMOS active region is referred to as an active region of the second or first semiconductor type.

The header cell 400A further comprises a plurality of gate regions 411, 412, 413, 414, 415, 418, 419 over the active regions 401, 402. For simplicity, reference numerals are omitted for some of the gate regions. The gate regions 411, 412, 413, 414, 415, 418, 419 are elongated along a second axis, e.g., a Y-axis, which is transverse to the X-axis. The gate regions 411, 412, 413, 414, 415, 418, 419 are arranged along the X-axis at a regular pitch designated at CPP (contacted poly pitch) in FIG. 4A. CPP is a center-to-center distance along the X-axis between two directly adjacent gate regions, e.g., the gate regions 414, 415 in FIG. 4A. Two gate regions are considered directly adjacent where there are no other gate regions therebetween. The gate regions 411, 412, 413, 414, 415, 418, 419 comprise a conductive material, such as polysilicon, which is sometimes referred to as "poly." The gate regions 411, 412, 413, 414, 415, 418, 419 are schematically illustrated in the drawings with the label "PO." Other conductive materials for the gate regions, such as metals, are within the scope of various embodiments. In the example configuration in FIG. 4A, the gate regions 411-415 are functional gate regions which, together with the active regions 401, 402, are configured as a plurality of transistors as described herein. In some embodiments, the gate regions 418, 419 are non-functional, or dummy, gate regions. Dummy gate regions are not configured to form transistors together with underlying active regions, and/or one or more transistors formed by dummy gate regions together with the underlying active regions are not electrically coupled to other circuitry in the header cell 400A and/or an IC device including the header cell 400A. In at least one embodiment, non-functional, or dummy, gate regions include dielectric material in a manufactured IC device.

The header cell 400A further comprises a plurality of active devices configured by the gate regions 411-415 and the active regions 401, 402. For example, a plurality of PMOS devices is configured by the PMOS active region 401 together with the corresponding gate regions 411-415. Because the PMOS devices are electrically coupled together as described herein, the PMOS devices effectively and collectively form a PMOS transistor. In other words, the gate regions 411-415 and the active region 401 are configured as a PMOS transistor which, in at least one embodiment, corresponds to the transistor P1. A plurality of NMOS devices is configured by the NMOS active region 402 together with the corresponding gate regions 411-415. Because the NMOS devices are electrically coupled together as described herein, the NMOS devices effectively and collectively form an NMOS transistor. In other words, the gate regions 411-415 and the active region 402 are configured as an NMOS transistor which, in at least one embodiment, corresponds to the transistor N1. The portions of the gate regions 411-415 over the active region 401 correspond to the gate terminal of the transistor P1. The portions of the gate regions 411-415 over the active region 402 correspond to the gate terminal of the transistor N1. Because the gate regions 411, 412, 413, 414, 415, 418, 419 extend continuously along the Y-axis from the first active region 401 to the second active region 402, the gate terminals of the transistors P1, N1 are electrically coupled together. Portions of the active region 401 on one side, e.g., the left side in FIG. 4A, of each of the gate regions 411-415 correspond to a source/drain of a corresponding PMOS device, and further portions of the active region 401 on the other side, e.g., the right side in FIG. 4A, of each of the gate regions 411-415 correspond to the other source/drain of the corresponding PMOS device. Portions of the active region 402 on one side, e.g., the left side in FIG. 4A, of each of the gate regions 411-415 correspond to a source/drain of a corresponding NMOS device, and further portions of the active region 402 on the other side, e.g., the right side in FIG. 4A, of each of the gate regions 411-415 correspond to the other source/drain of the corresponding NMOS device.

The described configuration where each of the transistors P1, N1 is configured by a plurality of gate regions is an example. Other configurations are within the scopes of various embodiments. For example, the number of gate regions 411-415 forming each of the transistors P1, N1 is not limited to the specific configuration in FIG. 4A. In some embodiments, the header cell 400A comprises a single functional gate region, e.g., gate region 411, between and directly adjacent dummy gate regions 418, 419. In at least one embodiment, the number of gate regions 411-415 forming the transistor P1, which is the switch transistor, is selected based on one or more factors, including, but not limited to, $R_{ON}$ or the driving strength of the corresponding header circuit. As the number of gate regions forming the switch transistor P1 is increased, $R_{ON}$ is decreased and the driving strength is increased, but the chip or wafer area occupied by the header circuit is also increased. In at least one embodiment, a selection of the number of gate regions forming the switch transistor P1 is a design consideration for balancing between performance (e.g., reduced $R_{ON}$ and/or increased driving strength) and area cost.

The header cell 400A further comprises contact structures over and in electrical contact with the corresponding portions in the active regions 401, 402. Contact structures are sometimes referred to as metal-to-device structures, and are schematically illustrated in the drawings with the label "MD." An MD contact structure includes a conductive material formed over a corresponding portion, e.g., a source/drain, in the corresponding active region to define an electrical connection from one or more devices formed in the active region to internal circuitry of the IC device or to outside circuitry. In the example configuration in FIG. 4A, MD contact structures 421-429 are over the active region 401, in electrical contact with the corresponding portions, i.e., source/drains of the transistor P1, and arranged alternatingly with the gate regions 418, 411-415, 419 along the X-axis. MD contact structures 431-439 are over the active region 402, in electrical contact with the corresponding portions, i.e., source/drains, of the transistor N1 and arranged alternatingly with the gate regions 418, 411-415, 419 along the X-axis. The MD contact structures 421-429 are correspondingly aligned with and spaced from the MD contact structures 431-439 along the Y-axis In some embodiments, spaces between the MD contact structures 421-429 and the corresponding MD contact structures 431-439 are formed by facing, natural ends of the MD contact structures 421-429, 431-439, wherein the natural ends are formed by one or more manufacturing processes for forming the MD structures. In some embodiments, the spaces between the MD contact structures 421-429 and the corresponding MD contact structures 431-439 are formed by a mask referred to as "cut-MD" (not shown). A pitch, i.e., a center-to-center distance along the X-axis, between directly adjacent MD contact structures is the same as the pitch CPP between directly adjacent gate regions, as shown, for example, at the MD contact structures 436, 437. Two MD contact structures are considered directly adjacent where there are no other MD contact structures therebetween. An example conductive material of the MD contact structures includes metal. Other configurations are within the scopes of various embodiments.

The header cell 400A further comprises via structures over and in electrical contact with the corresponding gate regions or MD contact structures. A via structure over and in electrical contact with an MD contact structure is sometimes referred to as via-to-device (VD). A via structure over and in electrical contact with a gate region is sometimes referred to as via-to-gate (VG). VD via structures are schematically illustrated in the drawings with the label "VD" or "VD2." VG via structures are schematically illustrated in the drawings with the label "VG." In the example configuration in FIG. 4A, a first row of VD via structures, representatively indicated at 450, 451, is over and in electrical contact with a first set of MD contact structures, i.e., the MD contact structures 421, 423, 425, 427, 429. A second row of VD via structures, representatively indicated at 452, 453, is over and in electrical contact with a second set of MD contact structures, i.e., the MD contact structures 422, 424, 426, 428. The MD contact structures 421, 423, 425, 427, 429 in the first set are arranged alternatingly with the MD contact structures 422, 424, 426, 428 in the second set along the X-axis. A third row of VD via structures, representatively indicated at 454, 455, is over and in electrical contact with the corresponding MD contact structures 421, 423, 425, 427, 429. A fourth row of VD via structures, representatively indicated at 456, 457, 458, 459 is over and in electrical contact with the corresponding MD contact structures 431-439. A plurality of via structures, representatively indicated at 461, 462, is over and in electrical contact with the corresponding gate regions 411-415. An example material of the VD and VG via structures includes metal. Other configurations are within the scopes of various embodiments.

The header cell 400A further comprises a plurality of metal layers and via layers sequentially and alternatingly arranged over the VD, VG via structures. The lowermost metal layer immediately over and in electrical contact with the VD, VG via structures is an M0 (metal-zero) layer, a next metal layer immediately over the M0 layer is an M1 layer, a next metal layer immediately over the M1 layer is an M2 layer, or the like. A via layer VIAn is arranged between and electrically couples the Mn layer and the Mn+1 layer, where n is an integer from zero and up. For example, a via-zero (VIA0 or V0) layer is the lowermost via layer which is arranged between and electrically couples the M0 layer and the M1 layer. Other via layers are VIA1 (or V1), VIA2 (or V2), or the like. The M0 layer is the lowermost metal layer over, or the closest metal layer to, the active regions 401, 402, on the front side of the substrate, as described herein.

In the header cell 400A, the M0 layer comprises M0 conductive patterns 471, 472, 473, 474, 475. The M0 conductive pattern 471 is over and in electrical contact with the first row of VD via structures including the VD via structures 450, 451. As a result, the MD contact structures 421, 423, 425, 427, 429 and the corresponding source/drains in the active region 401 are electrically coupled together, and collectively form the first terminal of the transistor P1. The M0 conductive pattern 472 is over and in electrical contact with the second row of VD via structures including the VD via structures 452, 453. As a result, the MD contact structures 422, 424, 426, 428 and the corresponding source/drains in the active region 401 are electrically coupled together, and collectively form the second terminal of the transistor P1. The M0 conductive pattern 473 is over and in electrical contact with the third row of VD via structures including the VD via structures 454, 455. As a result, the MD contact structures 421, 423, 425, 427, 429 and the corresponding source/drains in the active region 401 are also electrically coupled together by the M0 conductive pattern 473. In other words, both the M0 conductive patterns 471, 473 are electrically coupled to the first terminal of the transistor P1. The M0 conductive pattern 474 is over and in electrical contact with the VG via structures representatively indicated at 461, 462. As a result, the gate regions 411-415 are electrically coupled together, corresponding to the gate terminals of the transistors P1, N1 being electrically coupled together. The M0 conductive pattern 475 is over and in electrical contact with the fourth row of VD via structures including the VD via structures 456-459. As a result, the MD contact structures 431-439 and the corresponding source/drains in the active region 402 are electrically coupled together, corresponding to the first and second terminals of the transistor N1 being electrically coupled together, resulting in the transistor N1 being electrically coupled into a dummy transistor.

The labels on the left side of FIG. 4A indicate signals or voltages applicable to the M0 conductive patterns 471-475. For example, the M0 conductive pattern 471 is configured as a first power rail, e.g., a VDD power rail, for supplying VDD to a functional circuit operable by VDD. The M0 conductive pattern 472 is configured as a second power rail, e.g., a TVDD power rail, for receiving TVDD from another circuitry as described herein. In at least one embodiment, TVDD is applied from a conductive pattern or power rail in a metal layer above the M0 layer, e.g., in the M1 layer, through one or more V0 via structures, to the M0 conductive pattern 472, e.g., as described with respect to FIG. 5A. The M0 conductive pattern 473 is configured as a further VDD power rail for supplying VDD to the functional circuit. The M0 conductive pattern 474 is configured to apply the control signal Control to the gate regions 411-415, i.e., to the gate terminals of the transistors P1, N1. The M0 conductive pattern 475 is configured as a third power rail, e.g., a VSS power rail, that electrically couples the first and second terminals of the transistor N1 together. This configuration corresponds to the header circuit 300A where the predetermined voltage on the terminals of the transistor N1 is VSS. In the example configuration in FIG. 4A, the M0 layer is an example of a conductive layer having various conductive patterns for electrically coupling the transistor N1 into a dummy transistor, or for electrically coupling the transistor P1 to various power rails and the control signal. Other conductive layers are within the scopes of various embodiments.

The header cell 400A further comprises a boundary (or cell boundary) 480 which comprises edges 481, 482, 483, 484. The edges 481, 482 are elongated along the X-axis, and the edges 483, 484 are elongated along the Y-axis. The edges 481, 482, 483, 484 are connected together to form the closed boundary 480. In a place-and-route operation (also referred to as "automated placement and routing (APR)") described herein, cells are placed in an IC layout diagram in abutment with each other at their respective boundaries. The boundary 480 is sometimes referred to as "place-and-route boundary" and is schematically illustrated in the drawings with the label "prBoundary." The rectangular shape of the boundary 480 is an example. Other boundary shapes for various cells are within the scope of various embodiments. In some embodiments, the edges 481, 482 coincide with centerlines of the corresponding M0 conductive patterns 471, 475. In some embodiments, the edges 483, 484 coincide with centerlines of dummy or non-functional gate regions 418, 419. Between the edges 481, 482 and along the Y-axis, the header cell 400A contains one PMOS active region, i.e., 401, and one NMOS active region, i.e., 402, and is considered to have a height corresponding to one cell height. As described with respect to FIG. 6B, another cell or circuit region containing along the Y-axis two PMOS active regions and two NMOS active regions is considered to have a height corresponding to two cell heights, or double cell height. Example cross-sectional views corresponding to lines V-V and V'-V' in FIG. 4A are described with respect to FIGS. 5A-5B.

As described herein, in an IC device including a header circuit corresponding to the header cell 400A, in response to a first logic level of the control signal Control on the M0 conductive pattern 474, the transistor P1 is turned ON to connect the TVDD power rail configured by the M0 conductive pattern 472 to the VDD power rails configured by the M0 conductive patterns 471, 473. As a result, a functional circuit electrically coupled to the VDD power rails or M0 conductive patterns 471, 473 receives and operates on power supply from the TVDD power rail or M0 conductive pattern 472. In response to a second logic level of the control signal Control on the M0 conductive pattern 474, the transistor P1 is turned OFF to disconnect the TVDD power rail or M0 conductive pattern 472 from the VDD power rails or M0 conductive patterns 471, 473. As a result, power supply to the functional circuit is cut off, and the functional circuit is placed in a sleep or standby or powered-off state, in one or more embodiments.

As described herein, the transistor N1 is electrically coupled into a dummy transistor. This is different from a header circuit in accordance with other approaches, in which NMOS devices or transistors over an NMOS active region are not used, and gates, drains and sources of the NMOS transistors are left floating, e.g., without being electrically coupled to other circuitry. In such a header circuit in accordance with the other approaches, VG via structures of a PMOS switch transistor and a corresponding M0 conductive pattern for a control signal electrically coupled to the VG via structures are arranged at least partially over a PMOS active region of the PMOS switch transistor. As a result, routing resources, e.g., available tracks for M0 conductive patterns, for the PMOS switch transistor are limited by the presence of the M0 conductive pattern for the control signal.

In contrast, by electrically coupling the transistor N2 into a dummy transistor in accordance with some embodiments, it is possible to arrange the VG via structures 461, 462 and the corresponding M0 conductive pattern 474 away from the active region 401 and toward the active region 402, e.g., over a space between the active region 401 and the active region 402 as shown in FIG. 4A. As a result, additional routing resources for the switch transistor P1 become available over the corresponding PMOS active region 401. In the example configuration in FIG. 4A, such additional routing resources are realized in the form of an additional row of VD via structures 454, 455 and a corresponding additional VDD power rail, i.e., M0 conductive pattern 473, which is not available in accordance with the other approaches. In at least one embodiment, the additional VD via structures 454, 455 and the additional VDD power rail 473 contribute to reduce $R_{ON}$ and/or to increase the current density for the power supply through the header circuit. At the same cell width (i.e., the number of gate regions in a header circuit), $R_{ON}$ of a header circuit in accordance with some embodiments is reduced about 2%~4% compared to $R_{ON}$ of a header circuit in accordance with the other approaches. At the same $R_{ON}$ (e.g., required for an intended operation of a functional circuit to be powered), a header circuit in accordance with some embodiments requires fewer gate regions, i.e., a smaller chip or wafer area, compared to a header circuit in accordance with the other approaches. One or more of the described advantages, such as an increased power current density, reduced $R_{ON}$, a reduced chip or wafer area, or the like, are achievable in various embodiments.

Figure 4B:
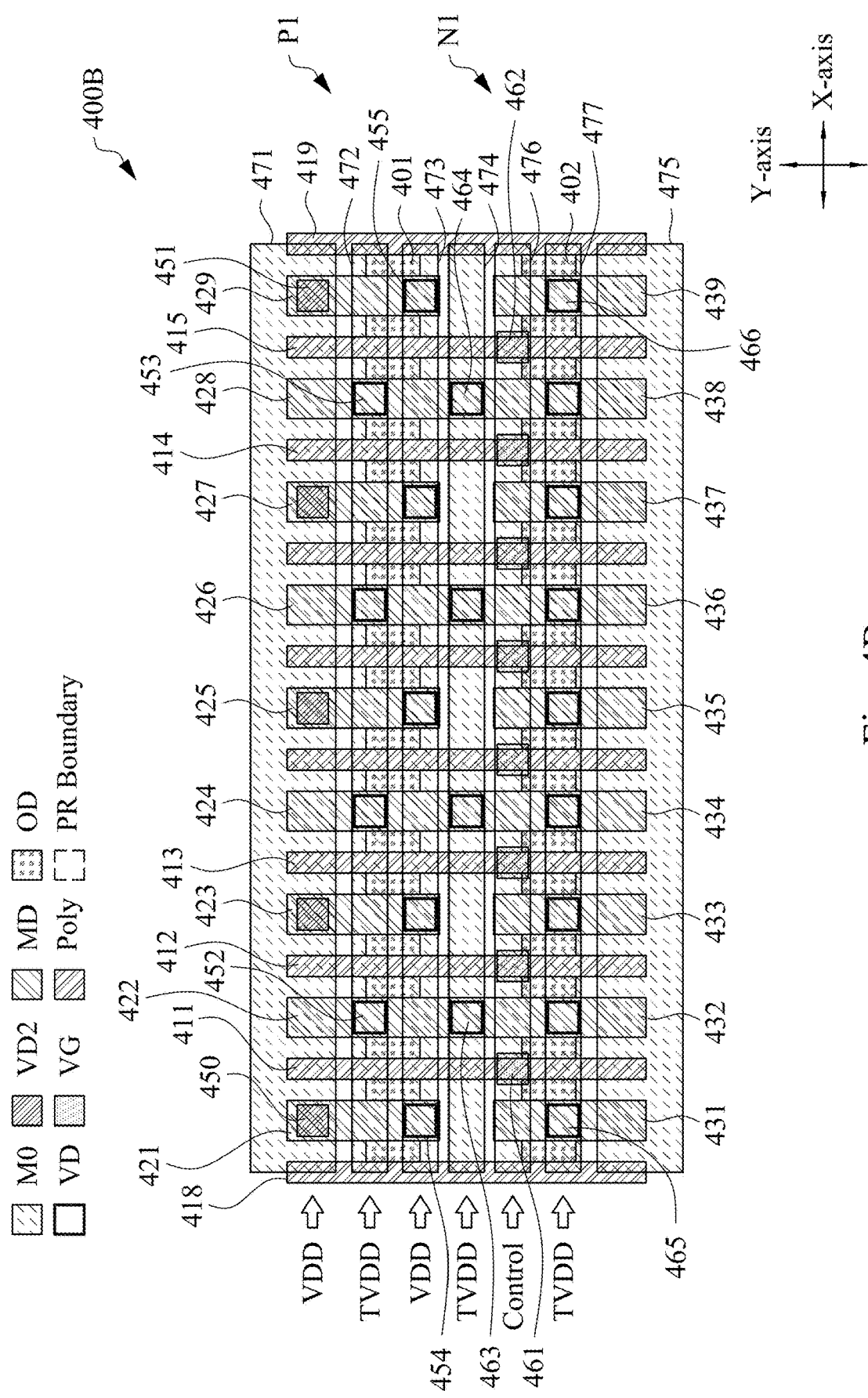

FIG. 4B is a schematic view of a layout diagram of a header cell 400B, in accordance with some embodiments. In at least one embodiment, the header cell 400B corresponds to the header circuit 300B. In at least one embodiment, the header cell 400B is stored as a standard cell in a standard cell library on a non-transitory computer-readable medium. Corresponding features in FIG. 4A and FIG. 4B are designated by the same reference numerals. For simplicity, the cell boundary of the header cell 400B, which is similar to the boundary 480 of the header cell 400A is omitted in FIG. 4B. The header cell 400B differs from the header cell 400A in the features described herein.

In the header cell 400B, the MD contact structures 422, 424, 426, 428 extend continuously along the Y-axis to be in electrical contact with multiple active regions, i.e., to be in electrical contact with both the active regions 401, 402. In other words, a set of the MD contact structures 422, 424, 426, 428 extends continuously from the first active region 401 to the second active region 402 to form a corresponding set of the MD contact structures 432, 434, 436, 438 over the second active region 402. The MD contact structures 422, 424, 426, 428 that are in electrical contact with multiple active regions are referred to herein as extended MD contact structures. A row of VD via structures, representatively indicated at 463, 464, is over and in electrical contact with the corresponding extended MD contact structures 422, 424, 426, 428. The VD via structures 463, 464 electrically couple the extended MD contact structures 422, 424, 426, 428 to the M0 conductive pattern 474.

Compared to the header cell 400A, the VG via structures 461, 462 in the header cell 400B are arranged further away from the active region 401, and are at least partially over the active region 402. A M0 conductive pattern 476 is over and in electrical contact with the VG via structures 461, 462 to receive the control signal Control from the M0 conductive pattern 476.

Instead of the VD via structures 431-439 electrically coupled to the VSS power rail or M0 conductive pattern 475 in the header cell 400A, the header cell 400B comprises a further row of VD via structures representatively indicated at 465, 466, over and in electrical contact with the MD contact structures 431-439 over the active region 402. A further M0 conductive pattern 477 is over and in electrical contact with the further row of VD via structures including the VD via structures 465, 466.

The labels on the left side of FIG. 4B indicate signals or voltages applicable to the M0 conductive patterns 471-474, 476, 477. Besides the M0 conductive pattern 472 configured as a TVDD power rail in a manner similar to the header cell 400A, the header cell 400B further comprises the M0 conductive patterns 474, 477 configured as additional TVDD power rails. In at least one embodiment, TVDD is applied to the M0 conductive patterns 474, 477 from one or more conductive patterns in an overlying metal layer, through one or more via structures, as described herein. The TVDD power rails, or M0 conductive patterns 472, 474, 474, are all electrically coupled to the second terminal of the transistor P1 through the extended MD contact structures 422, 424, 426, 428 and the corresponding VD via structures. This configuration corresponds to the header circuit 300B where the predetermined voltage on the terminals of the transistor N1 is TVDD. The additional TVDD power rails contribute to reduce $R_{ON}$ and/or to increase the current density for the power supply through a header circuit corresponding to the header cell 400B. In at least one embodiment, one or more advantages described herein are achievable in an IC device comprising such a header circuit.

Figure 4C:
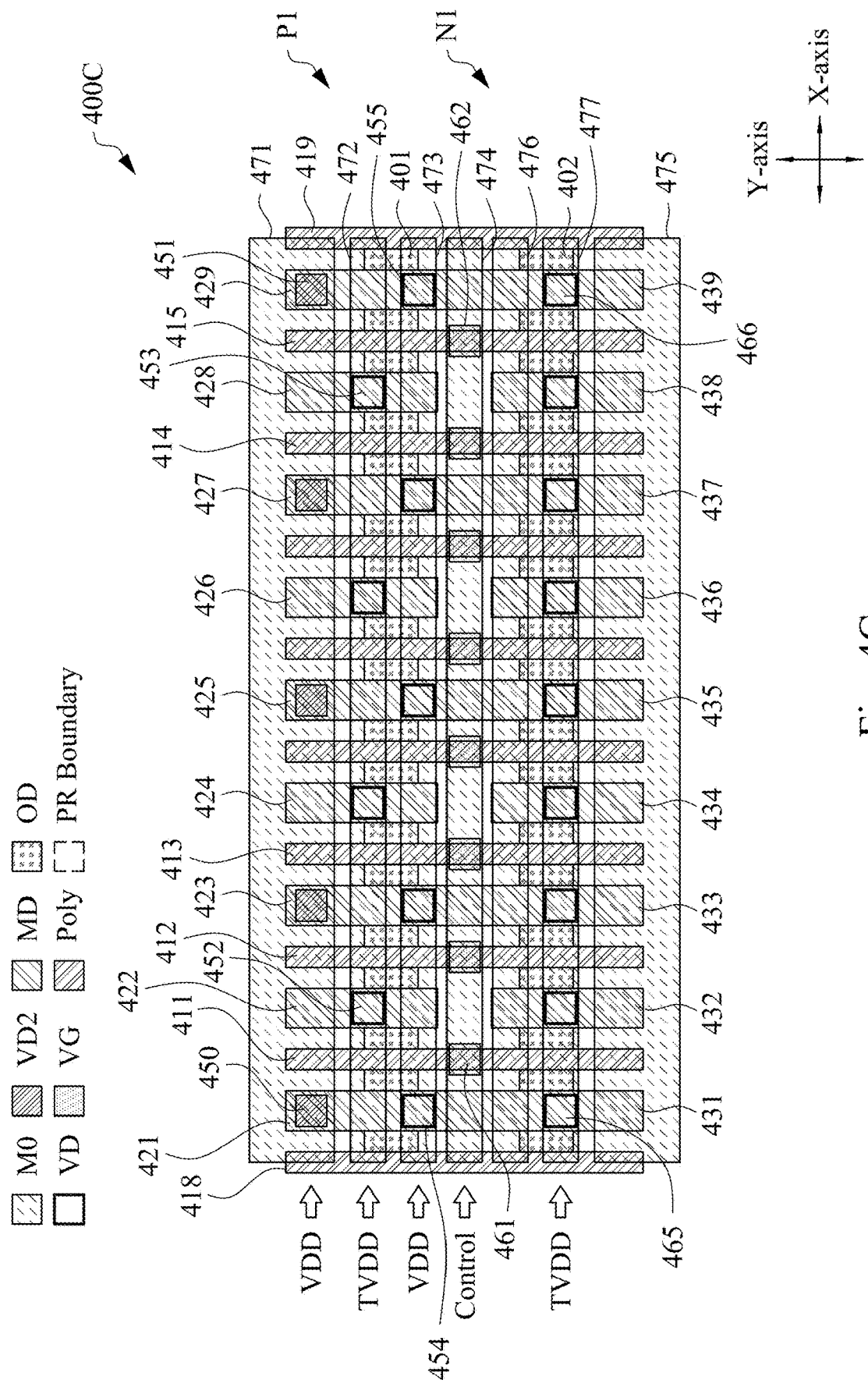

FIG. 4C is a schematic view of a layout diagrams of a header cell 400C, in accordance with some embodiments. In at least one embodiment, the header cell 400C corresponds to the header circuit 300C. In at least one embodiment, the header cell 400C is stored as a standard cell in a standard cell library on a non-transitory computer-readable medium. Corresponding features in FIG. 4A and FIG. 4C are designated by the same reference numerals. For simplicity, the cell boundary of the header cell 400C, which is similar to the boundary 480 of the header cell 400A is omitted in FIG. 4C. The header cell 400C differs from the header cell 400A in the features described herein.

In the header cell 400C, the MD contact structures 421, 423, 425, 427, 429 extend continuously along the Y-axis to be in electrical contact with multiple active regions, i.e., to be in electrical contact with both the active regions 401, 402. In other words, a set of the MD contact structures 421, 423, 425, 427, 429 extends continuously from the first active region 401 to the second active region 402 to form a corresponding set of the MD contact structures 431, 433, 435, 437, 439 over the second active region 402. The MD contact structures 421, 423, 425, 427, 429 are extended MD contact structures.

Instead of the VD via structures 431-439 electrically coupled to the VSS power rail or M0 conductive pattern 475 in the header cell 400A, the header cell 400C comprises a row of VD via structures representatively indicated at 465, 466, over and in electrical contact with the MD contact structures 431-439 over the active region 402. A further M0 conductive pattern 477 is over and in electrical contact with the further row of VD via structures including the VD via structures 465, 466. Although the M0 conductive pattern 476 is included in the example configuration in FIG. 4C, it is unused and may be omitted in one or more embodiments. In at least one embodiment, the MD contact structures 431-439 over the active region 402 are electrically coupled together by the M0 conductive pattern 476 rather than by the M0 conductive pattern 477.

The labels on the left side of FIG. 4C indicate signals or voltages applicable to the M0 conductive patterns 471-474, 477. Besides the M0 conductive patterns 471, 473 configured as VDD power rails in a manner similar to the header cell 400A, the header cell 400C further comprises the M0 conductive pattern 477 configured as an additional VDD power rail. The VDD power rails, or M0 conductive patterns 471, 473, 477, are all electrically coupled to the first terminal of the transistor P1 through the extended MD contact structures 421, 423, 425, 427, 429 and the corresponding VD via structures. This configuration corresponds to the header circuit 300C where the predetermined voltage on the terminals of the transistor N1 is VDD. The additional VDD power rails contribute to reduce $R_{ON}$ and/or to increase the current density for the power supply through a header circuit corresponding to the header cell 400C. In at least one embodiment, one or more advantages described herein are achievable in an IC device comprising such a header circuit.

Figure 4D:
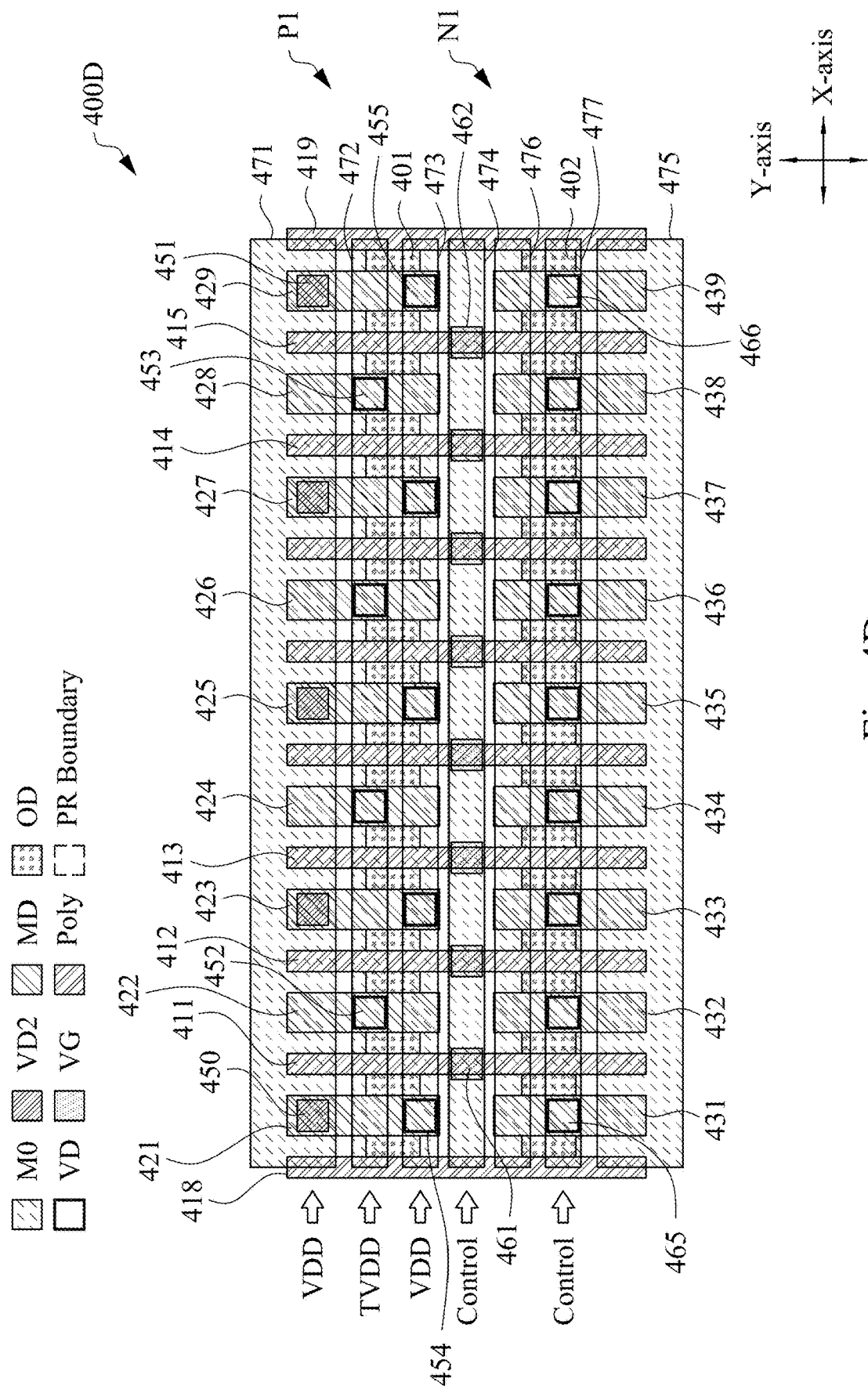

FIG. 4D is a schematic view of a layout diagrams of a header cell 400D, in accordance with some embodiments. In at least one embodiment, the header cell 400D corresponds to the header circuit 300D. In at least one embodiment, the header cell 400D is stored as a standard cell in a standard cell library on a non-transitory computer-readable medium. Corresponding features in FIG. 4A and FIG. 4D are designated by the same reference numerals. For simplicity, the cell boundary of the header cell 400D, which is similar to the boundary 480 of the header cell 400A, is omitted in FIG. 4D. The header cell 400D differs from the header cell 400A in the features described herein.

Instead of the VD via structures 431-439 electrically coupled to the VSS power rail or M0 conductive pattern 475 in the header cell 400A, the header cell 400D comprises a row of VD via structures representatively indicated at 465, 466, over and in electrical contact with the MD contact structures 431-439 over the active region 402. A further M0 conductive pattern 477 is over and in electrical contact with the further row of VD via structures including the VD via structures 465, 466. Although the M0 conductive pattern 476 is included in the example configuration in FIG. 4D, it is unused and may be omitted in one or more embodiments. In at least one embodiment, the MD contact structures 431-439 over the active region 402 are electrically coupled together by the M0 conductive pattern 476, rather than by the M0 conductive pattern 477.

The labels on the left side of FIG. 4D indicate signals or voltages applicable to the M0 conductive patterns 471-474, 477. The M0 conductive pattern 477 is configured to receive the control signal Control. This configuration corresponds to the header circuit 300D where the predetermined voltage on the terminals of the transistor N1 is the control signal Control. In at least one embodiment, one or more advantages described herein are achievable in a header circuit corresponding to the header cell 400D, and/or in an ID device comprising such a header circuit.

Figure 4E:
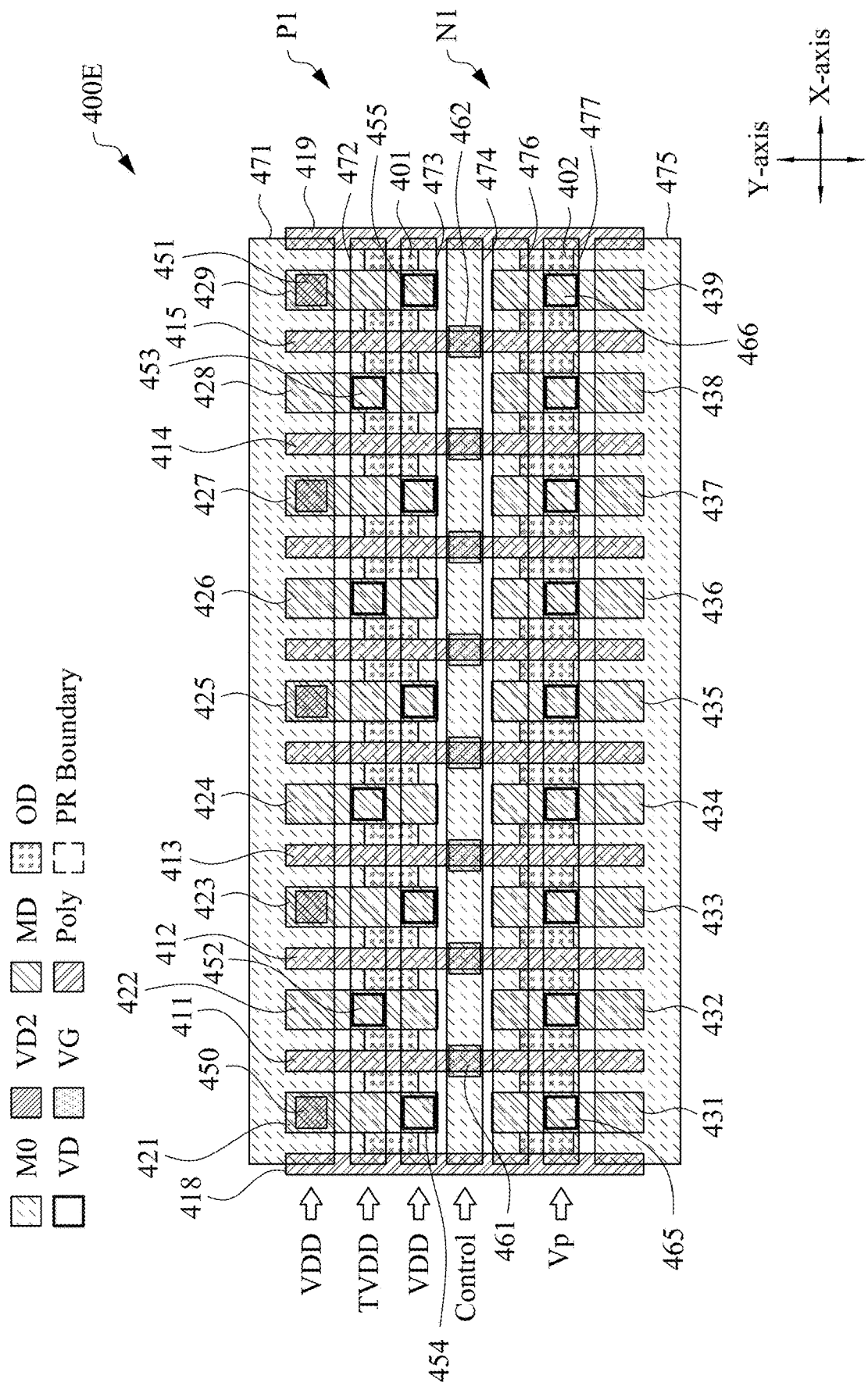

FIG. 4E is a schematic view of a layout diagrams of a header cell 400E, in accordance with some embodiments. In at least one embodiment, the header cell 400E corresponds to the header circuit 300E. In at least one embodiment, the header cell 400E is stored as a standard cell in a standard cell library on a non-transitory computer-readable medium. Corresponding features in FIG. 4D and FIG. 4E are designated by the same reference numerals. For simplicity, the cell boundary of the header cell 400E, which is similar to the boundary 480 of the header cell 400A is omitted in FIG. 4E.

The header cell 400E is similar to the header cell 400D, except for the signal applied to the M0 conductive pattern 477. The labels on the left side of FIG. 4E indicate signals or voltages applicable to the M0 conductive patterns 471-474, 477. Instead of the control signal Control as in the header cell 400D, the M0 conductive pattern 477 in the header cell 400E is configured to receive a signal or voltage Vp other than the control signal Control and the power supply voltages TVDD, VDD, VSS. This configuration corresponds to the header circuit 300E where the predetermined voltage on the terminals of the transistor N1 is the signal Vp. In at least one embodiment, one or more advantages described herein are achievable in a header circuit corresponding to the header cell 400E, and/or in an IC device comprising such a header circuit.

Figure 5A:
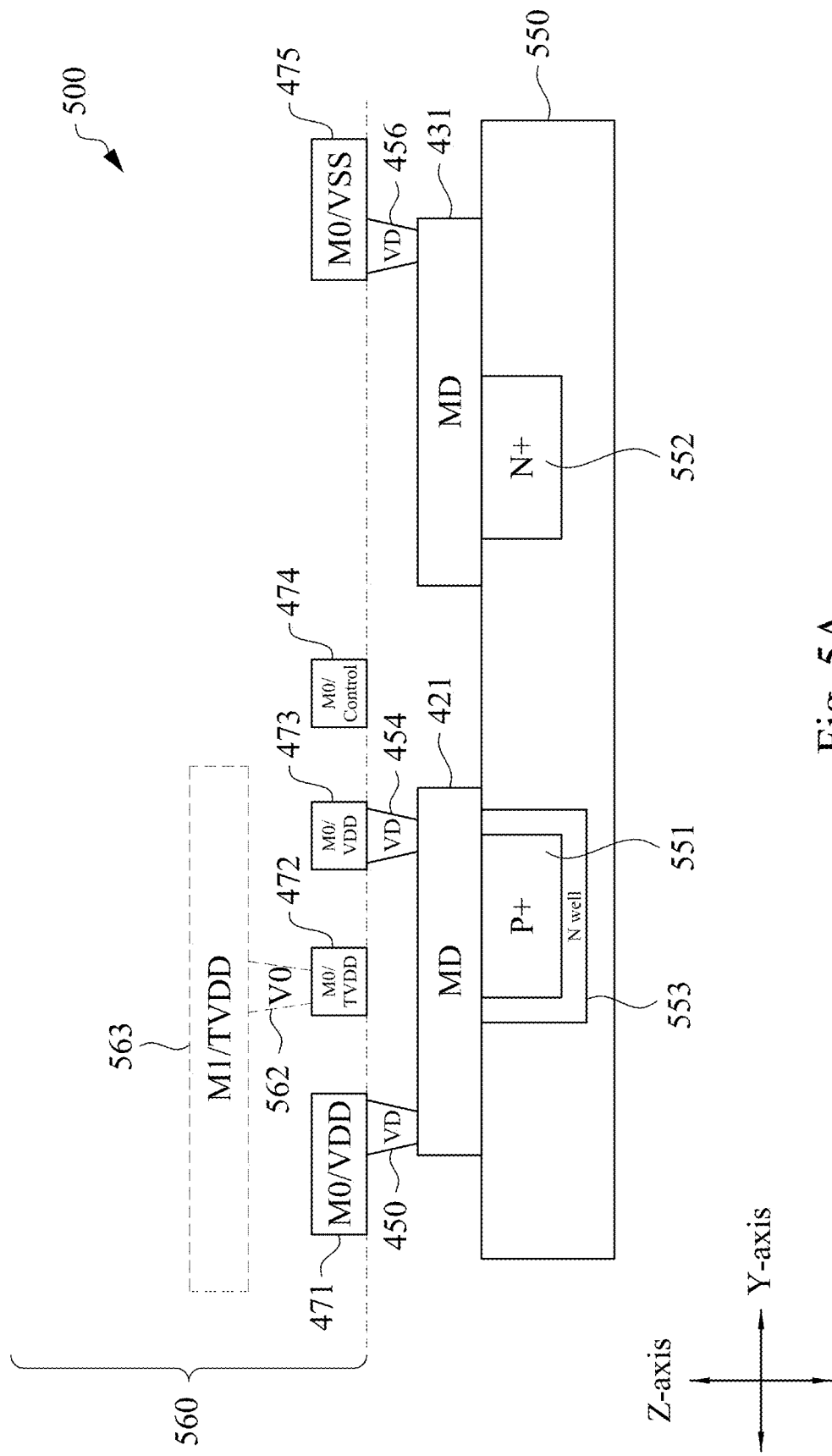
FIG. 5A is a schematic cross-sectional view, taken along line V-V in FIG. 4A, of an IC device, in accordance with some embodiments.

FIG. 5A is a schematic cross-sectional view, taken along line V-V in FIG. 4A, of an IC device 500, in accordance with some embodiments. The IC device 500 comprises a circuit region corresponding to the header cell 400A described with respect to FIG. 4A. Components in FIG. 5A having corresponding components in FIG. 4A are designated by the same reference numerals of FIG. 4A.

As illustrated in FIG. 5A, the IC device 500 comprises a substrate 550 over which the circuit region corresponding to the header cell 400A is formed. The substrate 550 has a thickness direction along a Z-axis. P-type and N-type dopants are added to the substrate 550 to correspondingly form a P-doped region 551 and an N-doped region 552 corresponding to the active regions 401, 402, and to also form an N well 553 in which the P-doped region 551 is formed. In some embodiments, isolation structures are formed between adjacent P well/P-doped regions and N well/N-doped regions. For simplicity, isolation structures are omitted from FIG. 5A. The P-doped region 551 defines a source/drain of a PMOS device constituting the transistor P1. The N-doped region 552 defines a source/drain of an NMOS device constituting the transistor N2.

The IC device 500 further comprises MD contact structures for electrically coupling the source/drains of the PMOS and NMOS devices to other circuit elements in the circuitry of the IC device 500. For example, the MD contact structures 421, 431 are correspondingly over and in electrical contact with the P-doped region 551 and N-doped region 552.

The IC device 500 further comprises VD, VG via structures over and in electrical contact with corresponding MD contact structures and/or gate regions. For example, although VG via structures are not visible in the cross-sectional view of FIG. 5A, FIG. 5 shows VD via structures 450, 454 over and in electrical contact with the MD contact structure 421, and a VD via structure 456 over and in electrical contact with the MD contact structure 431.

The IC device 500 further comprises an interconnect structure 560 which is over the VD, VG via structures. The interconnect structure 560 comprises a plurality of metal layers M0, M1, . . . and a plurality of via layers V0, V1, . . . . arranged alternatingly in the thickness direction of the substrate 550, i.e., along the Z axis. The interconnect structure 560 further comprises various interlayer dielectric (ILD) layers (not shown) in which the metal layers and via layers are embedded. The metal layers and via layers of the interconnect structure 560 are configured to electrically couple various elements or circuits of the IC device 500 with each other, and with external circuitry. For simplicity, metal layers and via layers above the M1 layer are omitted in FIG. 5A.

The M0 layer comprises M0 conductive patterns 471-475 correspondingly configured as a VDD power rail, a TVDD power rail, a further VDD power rail, a conductor for receiving and applying the control signal Control to the gates of the transistors P1, N1, and a VSS power rail. The M0 conductive patterns 471, 473, 475 are correspondingly over and in electrical contact with the VD via structures 450, 454, 456.

The V0 layer comprises a V0 via structure 562 over and in electrical contact with the TVDD power rail or M0 conductive pattern 472 in the M0 layer. The M1 layer comprises an M1 conductive pattern 563 over and in electrical contact with the V0 via structure 562. The V0 via structure 562 and the M1 conductive pattern 563 are schematically illustrated by dot-dot lines, because, in at least one embodiment, the V0 via structure 562 and/or the M1 conductive pattern 563 is/are not necessarily visible in the cross-sectional view of FIG. 5A. In some embodiments, the M1 conductive pattern 563 is configured as a TVDD power rail in the M1 layer to apply TVDD through the V0 via structures 562 to the M0 conductive pattern 472, which is the TVDD power rail in the M0 layer. In at least one embodiment, the IC device 500 comprises more than one V0 via structures between the M1 conductive pattern 563 and the M0 conductive pattern 472 to provide sufficient current density of the power supply. In some embodiments, the M0 conductive pattern 474 is configured to receive the control signal Control from a corresponding conductive pattern in the M1 layer through one or more V0 via structures in a similar manner.

As described herein, when the transistor P1 (not shown in FIG. 5A) is turned ON by a corresponding logic level of the control signal Control applied to the M0 conductive pattern 474, TVDD applied to the M0 conductive pattern 472 is output by the transistor P1, through the MD contact structure 421 and VD via structures 450, 454, to the M0 conductive patterns 471, 473 as VDD. VDD on the M0 conductive patterns 471, 473 is then applied to operate a functional circuit electrically coupled to the M0 conductive patterns 471, 473. The additional VD via structure 454 and M0 conductive pattern 473 for outputting VDD make it possible to, in one or more embodiments, reduce RON of the header circuit and/or increase the current density of the power supply to the functional circuit.

Figure 5B:
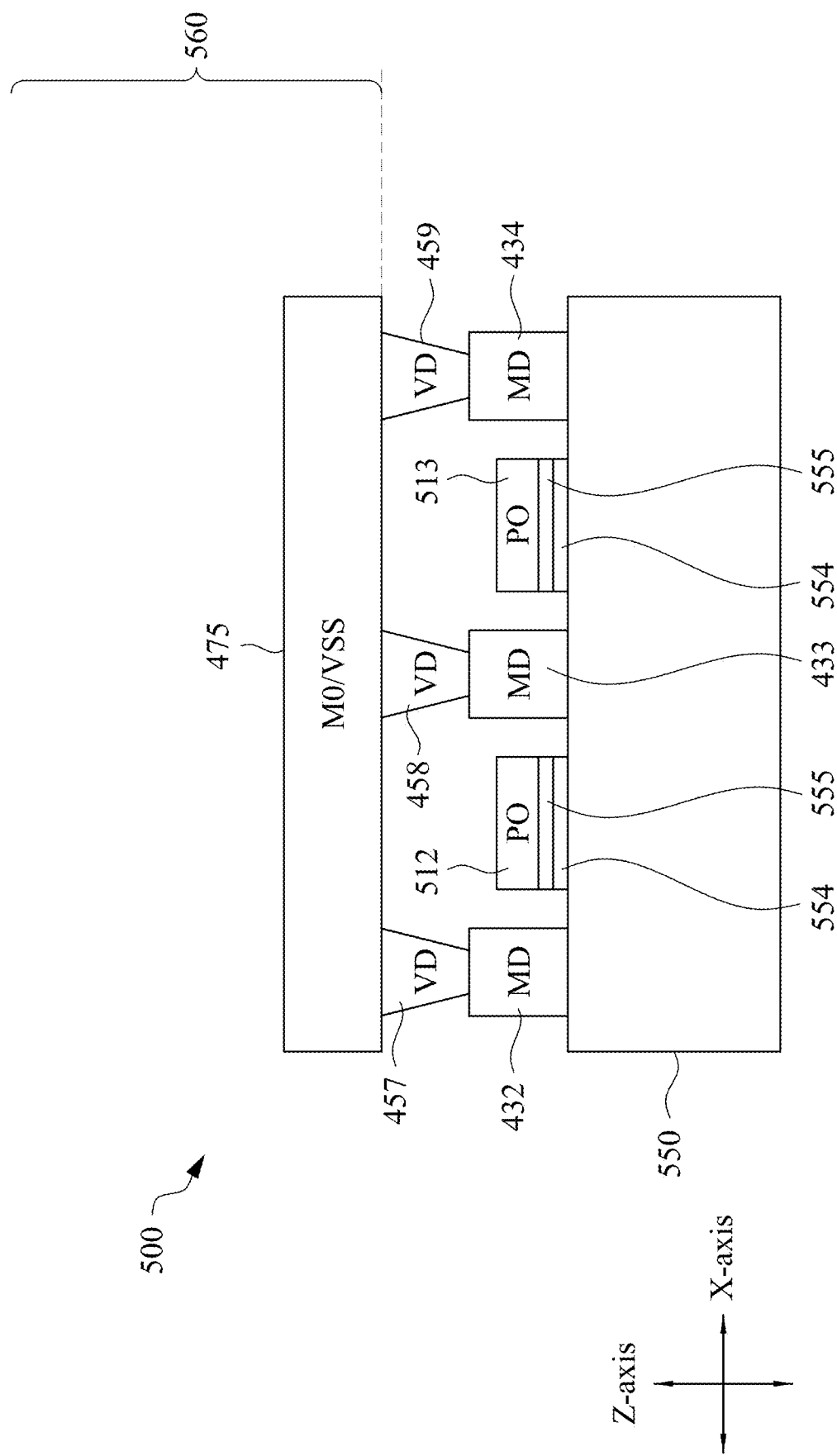
FIG. 5B is a schematic cross-sectional view, taken along line V'-V' in FIG. 4A, of an IC device, in accordance with some embodiments.

FIG. 5B is a schematic cross-sectional view, taken along line V'-V' in FIG. 4A, of the IC device 500, in accordance with some embodiments. Components in FIG. 5B having corresponding components in FIG. 4A are designated by the reference numerals of FIG. 4A.

As illustrated in FIG. 5B, the IC device 500 further comprises a gate stack corresponding to the gate region 412, and including gate dielectric layers 554, 555, and a gate electrode 512. The IC device 500 further comprises another gate stack corresponding to the gate region 413, and including gate dielectric layers 554, 555, and a gate electrode 513. In at least one embodiment, a gate dielectric layer replaces multiple gate dielectric layers 554, 555. Example materials of the gate dielectric layer or layers include $HfO_2$, $ZrO_2$, or the like. Example materials of the gate electrodes 512, 513 include polysilicon, metal, or the like.

The IC device 500 further comprises MD contact structures 432, 433, 434 electrically coupled to source/drains (not shown) of the NMOS devices constituting the transistor N1 (not shown). VD via structures 457, 458, 459 are correspondingly over and in electrical contact with the MD contact structures 432, 433, 434. The M0 conductive pattern 475 is over and in electrical contact with the VD via structures 457, 458, 459. As result, the source/drains of the NMOS devices constituting the transistor N1 are electrically coupled together, i.e., the transistor N1 is electrically coupled into a dummy transistor, as described herein. In at least one embodiment, one or more advantages described herein are achievable in the IC device 500.

Figure 6A:
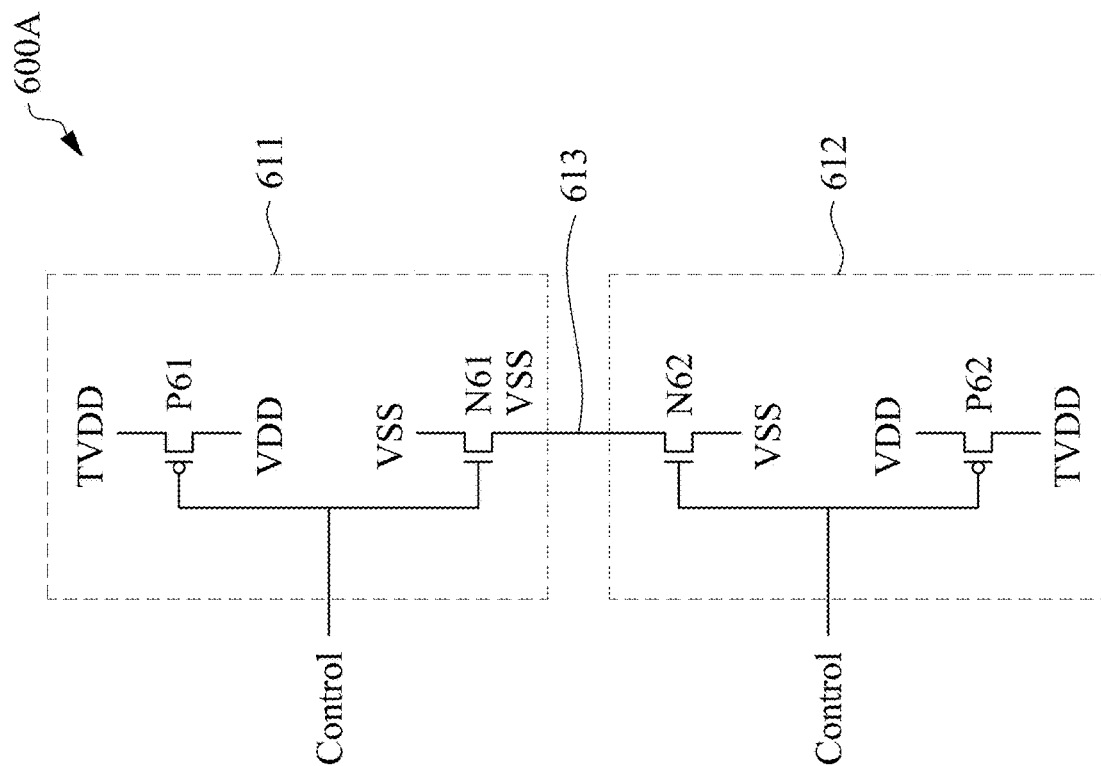
FIG. 6A is a schematic circuit diagram of a header circuit, in accordance with some embodiments.

FIG. 6A is a schematic circuit diagram of a header circuit 600A, in accordance with some embodiments.

The header circuit 600A comprises sub-circuits 611, 612 electrically coupled together at a VSS power rail 613. The sub-circuit 611 corresponds to the header circuit 300A, and comprises a switch transistor P61 and a dummy transistor N61. The switch transistor P61 and the dummy transistor N61 correspond to the switch transistor P1 and dummy transistor N1 of the header circuit 300A. The transistor P61 has first and second terminals electrically coupled correspondingly to VDD and TVDD. The dummy transistor N61 has first and second terminals electrically coupled to receive VSS. The gates of the transistors P61, N61 are electrically coupled to receive the control signal Control. The sub-circuit 612 corresponds to the header circuit 300A, and comprises a switch transistor P62 and a dummy transistor N62. The switch transistor P62 and the dummy transistor N62 correspond to the switch transistor P1 and dummy transistor N1 of the header circuit 300A. The transistor P62 has first and second terminals electrically coupled correspondingly to VDD and TVDD. The dummy transistor N62 has first and second terminals electrically coupled to receive VSS. The gates of the transistors P62, N62 are electrically coupled to receive the control signal Control. The terminals of the transistor N61 are electrically coupled to the terminals of the transistor N62 at the VSS power rail 613. The sub-circuits 611, 612 are configured to operate as described with respect to FIGS. 2 and 3A.

The described configuration in which the header circuit 600A comprises two sub-circuits which correspond to the header circuit 300A is an example. Other configurations are within the scopes of various embodiments. For example, in some embodiments, the header circuit 600A comprises more than two sub-circuits and/or the sub-circuits of the header circuit 600A correspond to any of the header circuits 300A-300E. In at least one embodiment, one or more advantages described herein are achievable in the header circuit 600A and/or an IC device comprising the header circuit 600A.

Figure 6B:
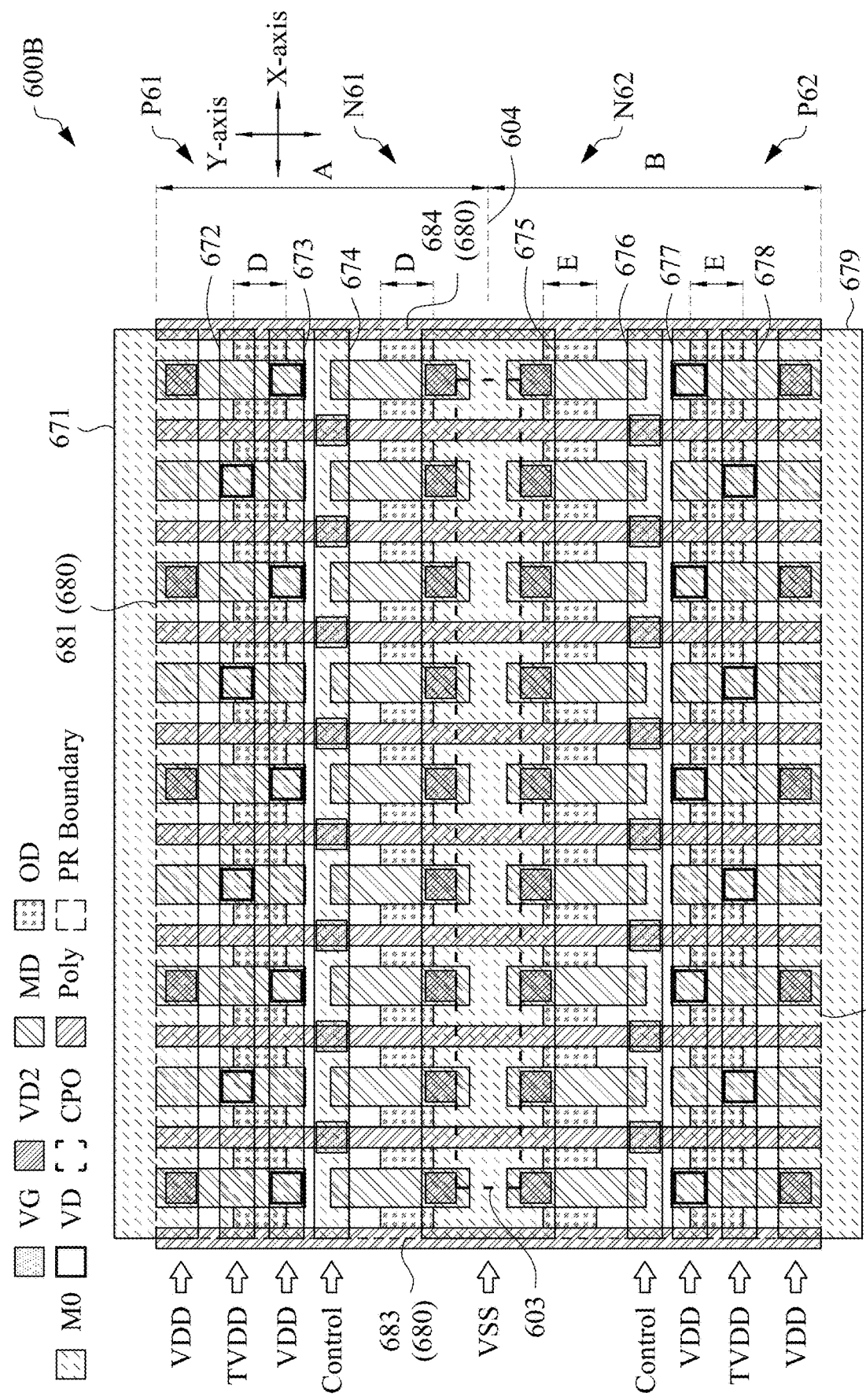
FIG. 6B is a schematic view of a layout diagram of a header cell, in accordance with some embodiments.

FIG. 6B is a schematic view of a layout diagram of a header cell 600B, in accordance with some embodiments. In at least one embodiment, the header cell 600B corresponds to the header circuit 600A. In at least one embodiment, the header cell 600B is stored as a standard cell in a standard cell library on a non-transitory computer-readable medium. Corresponding features in FIG. 6A and FIG. 6B are designated by the same reference numerals. Features in FIG. 6B having corresponding features in FIG. 4A are designated by the reference numerals of FIG. 4A increased by 200. For example, M0 conductive patterns 671-675 and a boundary 680 with edges 681-684 in the header cell 600B correspond to the M0 conductive patterns 471-475 and the boundary 480 with edges 481-484 in the header cell 400A.

The header cell 600B comprises a section A corresponding to the sub-circuit 611, and a section B corresponding to the sub-circuit 612. Each of the sections A and B of the header cell 600B comprises a PMOS active region, an NMOS active region, gate regions, MD contact structures, VD and VG via structures and M0 conductive patterns which are arranged and electrically coupled as described with respect to FIG. 4A. The header cell 600B further comprises a cut-poly region 603 of a cut-poly mask which extends along the X-axis and indicate an area where the gate regions of the section A are disconnected from the gate regions of the section B. The cut-poly region 603 is schematically illustrated in the drawings with the label "CPO."

The labels on the left side of FIG. 6B indicate signals or voltages applicable to the M0 conductive patterns. For example, the M0 conductive patterns 671-674 in the section A are correspondingly configured as a first VDD power rail, a first TVDD power rail, a second VDD power rail, and a first conductor for receiving and applying the control signal Control to the gates of the transistors P61, N61. M0 conductive patterns 681-684 in the section B correspond to the M0 conductive patterns 671-674, and are correspondingly configured as a third VDD power rail, a second TVDD power rail, a fourth VDD power rail, and a second conductor for receiving and applying the control signal Control to the gates of the transistors P62, N62. The M0 conductive pattern 675 is configured as a VSS power rail common for both the section A and the section B.

Each of the section A and section B comprises, along the Y-axis, a PMOS active region and an NMOS active region, and corresponds to a header cell of one cell height, as described with respect to FIG. 4A. The header cell 600B is a combination of two header cells of one cell height, and is considered to have a height corresponding to two cell heights, or double cell height. For simplicity, the cell height of the section A is also referred as "A," and the cell height of the section B is also referred as "B." The cell height A is a dimension along the Y-axis from the edge 681 of the boundary 680 to a center line 604 of the cut-poly region 603. The cell height B is a dimension along the Y-axis from the edge 682 of the boundary 680 to the center line 604 of the cut-poly region 603. In some embodiments, the cell height A is the same as the cell height B. In one or more embodiments, the cell height A is different from the cell height B. The described configuration of the header cell 600B as a header cell having a double cell height is an example. Other configurations, in which the header cell 600B has a greater than double cell height, are within the scopes of various embodiments.

Besides the cell height, the sections A and B may differ from each other in active region width (also referred to as "OD width"). An active region width, or OD width, is a dimension of an active region along the Y-axis. For example, each of the PMOS and NMOS active regions in the section A has an OD width D, as illustrated in FIG. 6B. Each of the PMOS and NMOS active regions in the section B has an OD width E, as illustrated in FIG. 6B. In some embodiments, the OD width D is the same as the OD width E. In one or more embodiments, the OD width D is different from the OD width E. In at least one embodiment, one or more advantages described herein are achievable in a header circuit corresponding to the header cell 600B, or an IC device comprising such a header circuit.

Figure 7A:
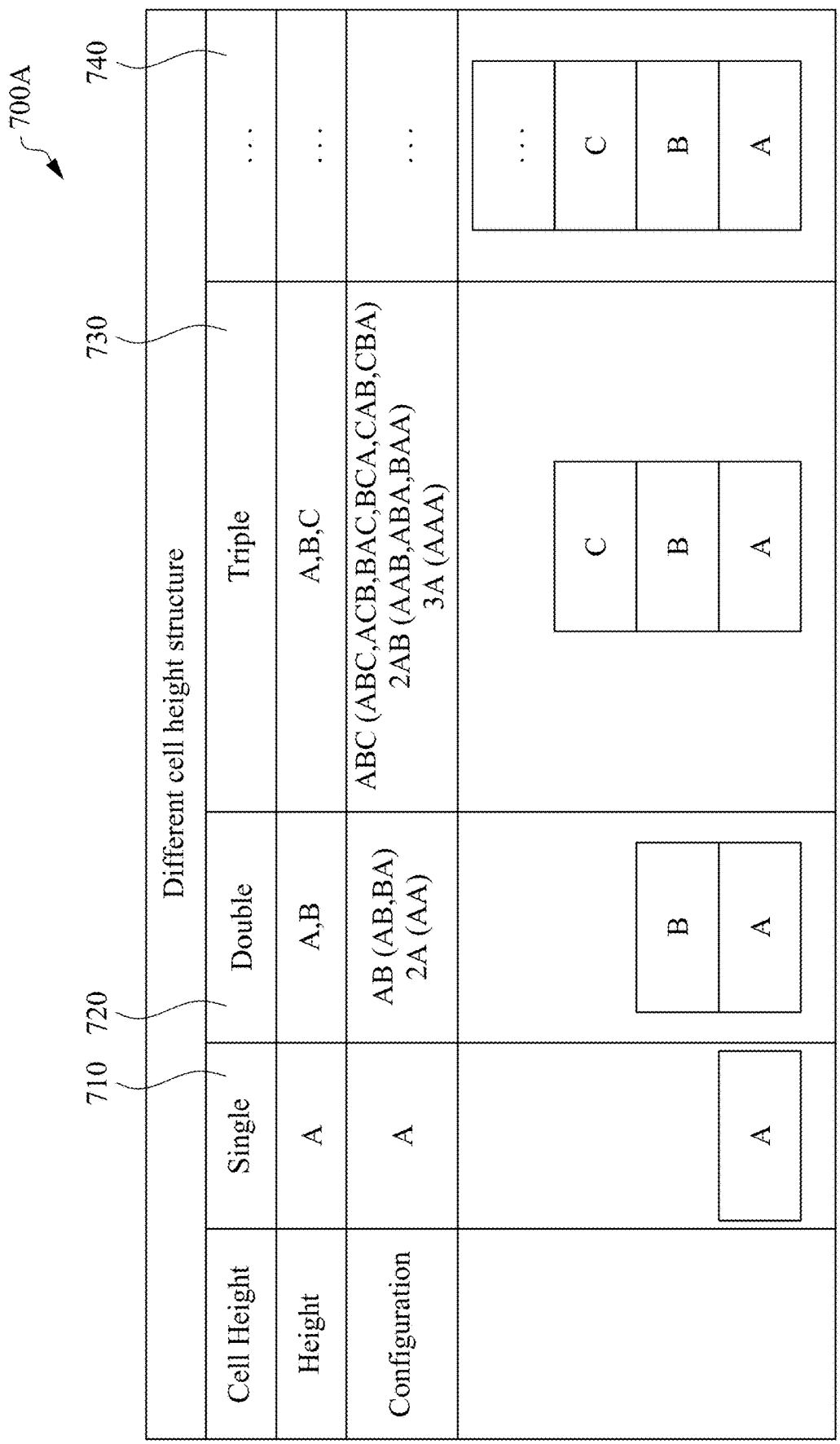
Figure 8C:
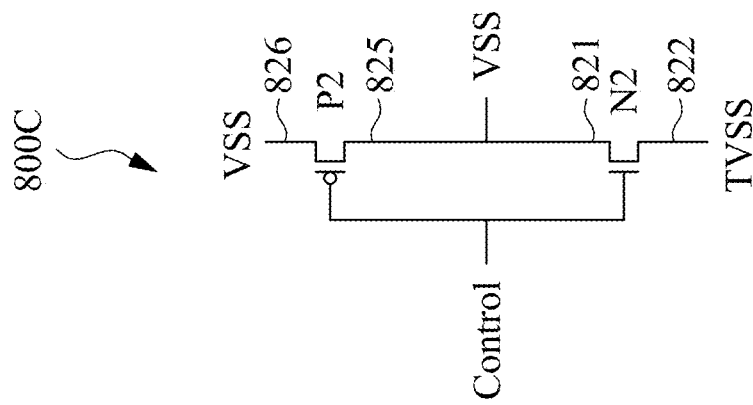
Figure 8B:
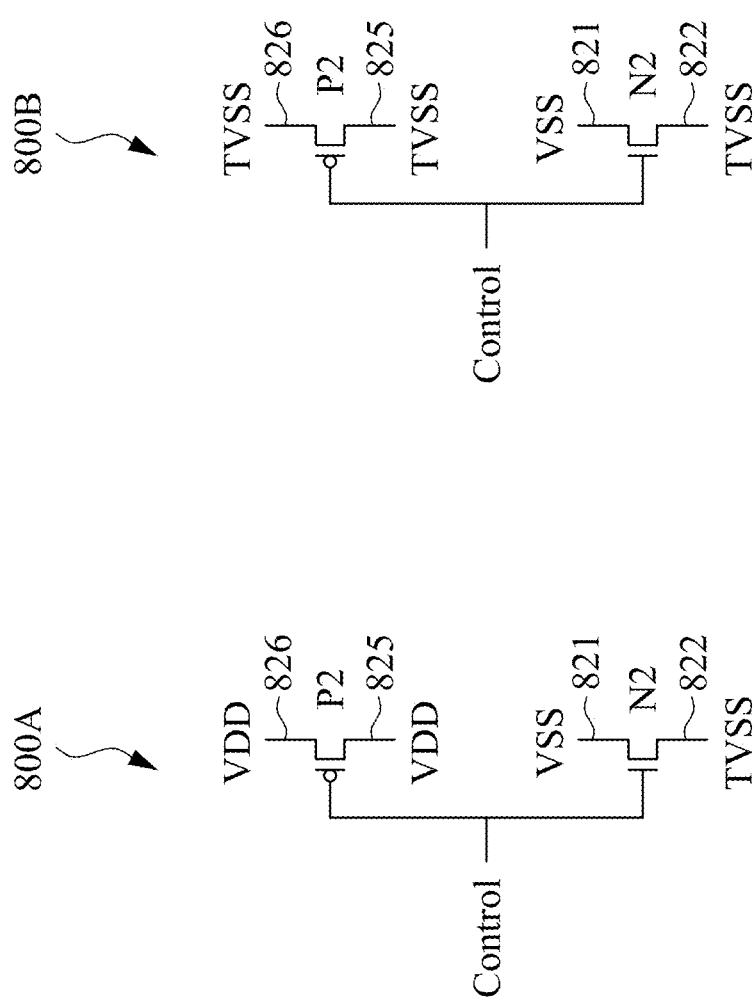
Figure 8A:
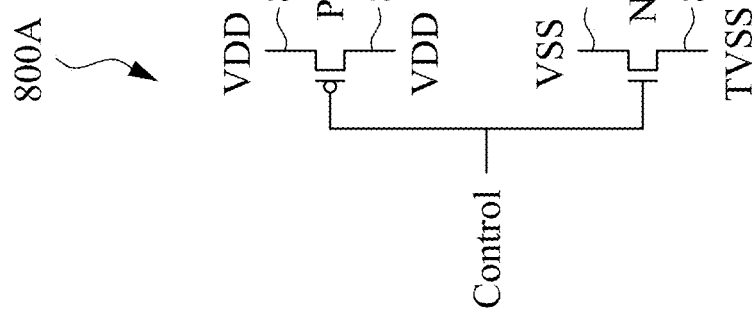

FIGS. 7A and 7B are tables 700A and 700B schematically showing various layout diagram configurations with different cell heights, in accordance with some embodiments. The tables 700A, 700B show various situations where one or more unit header cells are combinable into a larger header cell. In some embodiments, each unit header cell corresponds to one of the header cells 400A-400E in FIGS. 4A-4E, or the section A or the section B in FIG. 6B.

The table 700A in FIG. 7A shows various layout diagram configurations where the cell heights of the unit header cells are the same or different, in accordance with some embodiments.

As shown in column 710 of the table 700A, a single-cell-height header cell consists of one unit header cell having a cell height A. There is one configuration indicated at A for such a header cell.

As shown in column 720 of the table 700A, a double-cell-height header cell is a combination of two unit header cells having corresponding cell heights A and B. There are two situations where A is different from B, and where A is the same as B. For A being different from B, there are two configurations, i.e., AB as illustrated in FIG. 6A, and BA which is a reversed configuration of FIG. 6B where the sections A and B switch place along the Y-axis. For A being the same as B, there is one configuration AA corresponding to the configuration in FIG. 6B where the cell heights A and B are the same.

As shown in column 730 of the table 700A, a triple-cell-height header cell is a combination of three unit header cells having corresponding cell heights A, B, C. There are three situations where all three cell heights A, B, C are different, where two of the cell heights are the same, and where all three cell heights are the same. For situations where all three cell heights A, B, C are different, there are six different configurations in which the three unit header cells with the corresponding cell heights A, B, C may be stacked one upon another along the Y-axis, i.e., ABC, ACB, BAC, BCA, CAB, CBA. For situations where two of the cell heights are the same, e.g., A is the same as C, there are three different configurations in which the three unit header cells with the corresponding cell heights A, A, B may be stacked one upon another along the Y-axis, i.e., AAB, ABA, BAA. For situations where all of the cell heights are the same, e.g., A, B and C are equal, there is one configuration AAA.

As shown in column 740 of the table 700A, further configurations where more than three unit header cells are combinable into a larger header cell are possible, in accordance with various embodiments. In at least one embodiment, one or more advantages described herein are achievable in header circuits corresponding to the header cells described with respect to FIG. 7A, and/or IC devices comprising such header circuits.

The table 700B in FIG. 7B shows various layout diagram configurations where the OD widths of the unit header cells are the same or different, in accordance with some embodiments.

As shown in column 712 of the table 700B, a single-cell-height header cell consists of one unit header cell having an OD width D. There is one configuration indicated at D for such a header cell.

As shown in column 722 of the table 700B, a double-cell-height header cell is a combination of two unit header cells having corresponding OD widths D and E. There are two situations where D is different from E, and where D is the same as E. For D being different from E, there are two configurations, i.e., DE as illustrated in FIG. 6B, and ED which is a reversed configuration of FIG. 6B where the sections A and B switch place along the Y-axis. For D being the same as E, there is one configuration DD corresponding to the configuration in FIG. 6B where the OD widths D and E are the same.

As shown in column 732 of the table 700B, a triple-cell-height header cell is a combination of three unit header cells having corresponding OD widths D, E, F. There are three situations where all three OD widths D, E, F are different, where two of the OD widths are the same, and where all three OD widths are the same. For situations where all three OD widths D, E, F are different, there are six different configurations in which the three unit header cells with the corresponding OD widths D, E, F may be stacked one upon another along the Y-axis, i.e., DEF, DFE, EDF, EFD, FDE, FED. For situations where two of the OD widths are the same, e.g., D is the same as F, there are three different configurations in which the three unit header cells with the corresponding OD widths D, D, E may be stacked one upon another along the Y-axis, i.e., DDE, DED, EDD. For situations where all of the OD widths are the same, e.g., D, E and F are equal, there is one configuration DDD.

As shown in column 742 of the table 700B, further configurations where more than three unit header cells are combinable into a larger header cell are possible, in accordance with various embodiments. In at least one embodiment, one or more advantages described herein are achievable in header circuits corresponding to the header cells described with respect to FIG. 7B, and/or IC devices comprising such header circuits.

In some embodiments, the configurations and/or advantages for header cells and header circuits described with respect to FIGS. 3A-7B are applicable to footer cells and footer circuits, with PMOS, NMOS, TVDD, VDD, VSS in header cells and header circuits corresponding to NMOS, PMOS, TVSS, VSS, VDD in footer cells and footer circuits. Several examples of footer cells and footer circuits as described with respect to FIGS. 8A-8E and 9A-9C.

FIGS. 8A-8E are schematic circuit diagrams of various footer circuits 800A-800E, in accordance with some embodiments. In at least one embodiment, one or more of the footer circuits 800A-800E correspond to the footer circuit 220 in FIG. 2. Components in FIGS. 8A-8E having corresponding components in FIG. 2 are designated by the same reference numerals of FIG. 2 or by the reference numerals of FIG. 2 increased by 600.

In FIGS. 8A-8E, each of the footer circuits 800A-800E comprises a first transistor N2 and a second transistor P2 as described with respect to FIG. 2. Specifically, gate terminals of the transistors N2, P2 are electrically coupled to receive a control signal Control corresponding to the control signal CS2 in FIG. 2. The transistor N2 is a switch transistor, and comprises a first terminal 821 electrically coupled to a VSS power rail, and a second terminal 822 electrically coupled to a TVSS power rail. The transistor P2 is electrically coupled as a dummy transistor, and comprises a first terminal 825 and a second terminal 826 electrically coupled to receive the same predetermined voltage.

The predetermined voltage on the terminals 825, 826 of the transistor P2 differs among the footer circuits 800A-800E. In the footer circuit 800A in FIG. 8A, the predetermined voltage on the terminals 825, 826 of the transistor P2 is VDD. In the footer circuit 800B in FIG. 8B, the predetermined voltage on the terminals 825, 826 of the transistor P2 is TVSS. In the footer circuit 800C in FIG. 8C, the predetermined voltage on the terminals 825, 826 of the transistor P2 is VSS. In the footer circuit 800D in FIG. 8D, the predetermined voltage on the terminals 825, 826 of the transistor P2 is the control signal Control. In the footer circuit 800E in FIG. 8E, the predetermined voltage on the terminals 825, 826 of the transistor P2 is Vp which is a voltage or signal other than power supply voltages VDD, TVSS and VSS, and control signal Control. As described herein, examples of the predetermined voltage on the terminals 825, 826 of the transistor P2 in accordance with some embodiments include a power supply voltage, such as VDD, TVSS, or VSS, a control signal, such as Control, or a voltage other than VDD, TVSS, VSS, and Control. Other voltage configurations are within the scopes of various embodiments. In at least one embodiment, one or more advantages described herein are achievable in one or more of the footer circuits 800A-800E, and/or IC devices comprising one or more of the footer circuits 800A-800E.

Figure 9A:
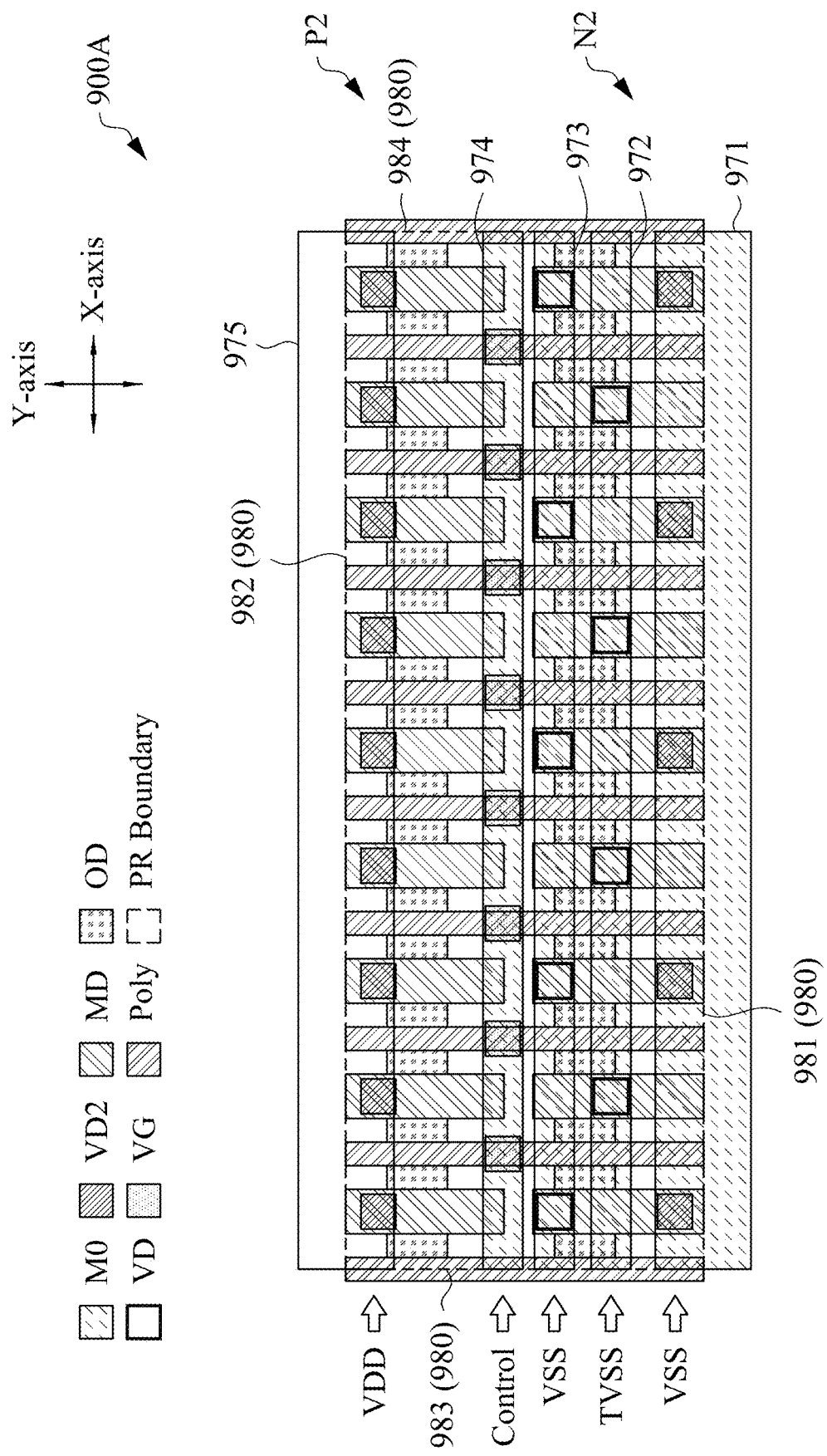
FIG. 9A is a schematic view of a layout diagram of a footer cell, in accordance with some embodiments.

FIG. 9A is a schematic view of a layout diagram of a footer cell 900A, in accordance with some embodiments. In at least one embodiment, the footer cell 900A corresponds to the footer circuit 800A. In at least one embodiment, the footer cell 900A is stored as a standard cell in a standard cell library on a non-transitory computer-readable medium.

In the example configuration in FIG. 9A, the footer cell 900A is a mirror image of the header cell 400A in FIG. 4A. For example, the footer cell 900A is obtained by flipping the header cell 400A across the X-axis. In some embodiments, example layouts of footer cells corresponding to the footer circuits 800B-800E are obtained by flipping the corresponding header cells 400B-400E across the X-axis. Components in FIG. 9A having corresponding components in FIG. 4A are designated by the reference numerals of FIG. 9A increased by 500. For example, M0 conductive patterns 971-975 and a boundary 980 with edges 981-984 in the footer cell 900A correspond to the M0 conductive patterns 471-475 and the boundary 480 with edges 481-484 in the header cell 400A.

The labels on the left side of FIG. 9A indicate signals or voltages applicable to the M0 conductive patterns 971-975. For example, the M0 conductive pattern 971 is configured as a first power rail, e.g., a VSS power rail, for supplying VSS to a functional circuit operable by VSS. The M0 conductive pattern 972 is configured as a second power rail, e.g., a TVSS power rail, for receiving TVSS from another circuitry as described herein. In at least one embodiment, TVSS is applied from a conductive pattern or power rail in a metal layer above the M0 layer, e.g., in the M1 layer, through one or more V0 via structures, to the M0 conductive pattern 972. The M0 conductive pattern 973 is configured as a further VSS power rail for supplying VSS to the functional circuit. The M0 conductive pattern 974 is configured to apply the control signal Control to the gate terminals of the transistors N2, P2. The M0 conductive pattern 975 is configured as a third power rail, e.g., a VDD power rail, that electrically couples the first and second terminals of the transistor P2 together. This configuration corresponds to the footer circuit 800A where the predetermined voltage on the terminals of the transistor P2 is VDD. In at least one embodiment, the additional VSS power rails 971, 973 and the corresponding VD via structures contribute to achieve one or more of the described advantages, such as an increased power current density, reduced $R_{ON}$, a reduced chip or wafer area, or the like.

Figure 9B:
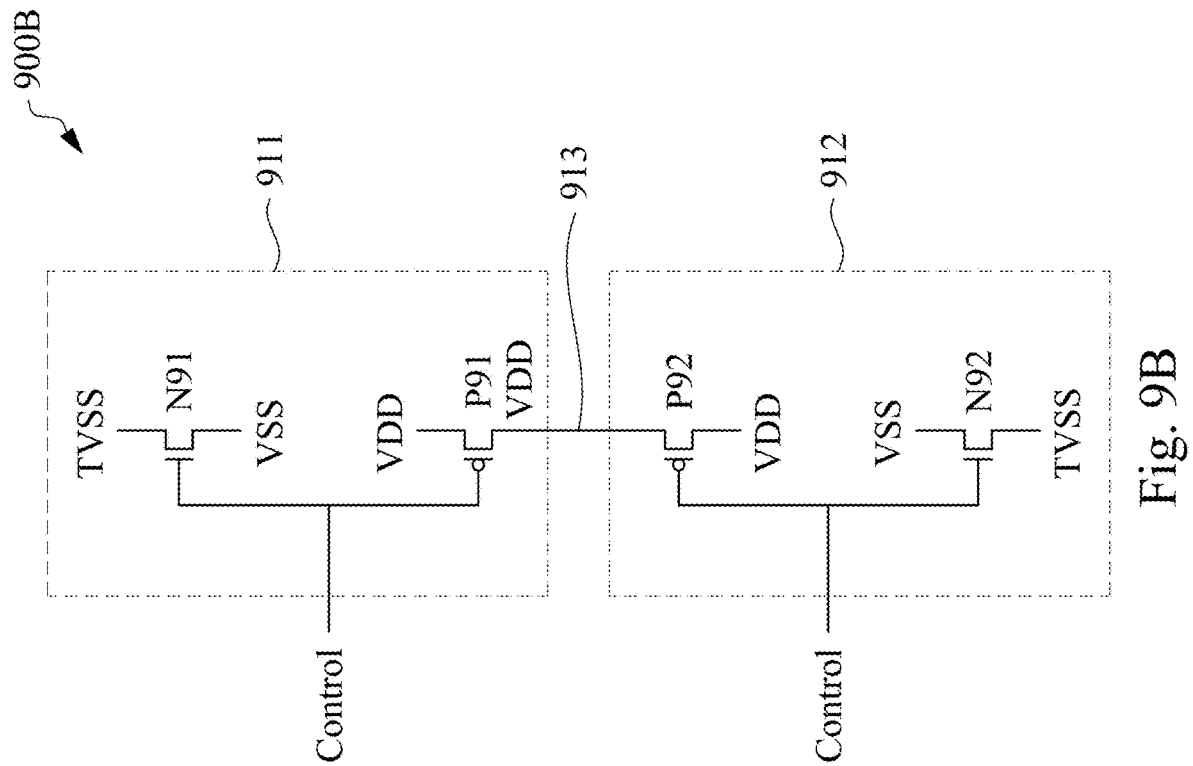
FIG. 9B is a schematic circuit diagram of a footer circuit, in accordance with some embodiments.

FIG. 9B is a schematic circuit diagram of a footer circuit 900B, in accordance with some embodiments.

The footer circuit 900B comprises sub-circuits 911, 912 electrically coupled together at a VDD power rail 913. The sub-circuit 911 corresponds to the footer circuit 800A, and comprises a switch transistor N91 and a dummy transistor P91. The switch transistor N91 and the dummy transistor P91 correspond to the switch transistor N2 and dummy transistor P2 of the footer circuit 800A. The transistor N91 has first and second terminals electrically coupled correspondingly to VSS and TVSS. The dummy transistor P91 has first and second terminals electrically coupled to receive VDD. The gates of the transistors N91, P91 are electrically coupled to receive the control signal Control. The sub-circuit 912 corresponds to the footer circuit 800A, and comprises a switch transistor N92 and a dummy transistor P92. The switch transistor N92 and the dummy transistor P92 correspond to the switch transistor N2 and dummy transistor P2 of the footer circuit 800A. The transistor N92 has first and second terminals electrically coupled correspondingly to VSS and TVSS. The dummy transistor P92 has first and second terminals electrically coupled to receive VDD. The gates of the transistors N92, P92 are electrically coupled to receive the control signal Control. The terminals of the transistor P91 are electrically coupled to the terminals of the transistor P92 at the VDD power rail 913. The sub-circuits 911, 912 are configured to operate as described with respect to FIG. 2.

The described configuration in which the footer circuit 900B comprises two sub-circuits which correspond to the footer circuit 800A is an example. Other configurations are within the scopes of various embodiments. For example, in some embodiments, the footer circuit 900B comprises more than two sub-circuits and/or the sub-circuits of the footer circuit 900B correspond to any of the footer circuits 800A-800E. In at least one embodiment, one or more advantages described herein are achievable in the footer circuit 900B and/or an IC device comprising the footer circuit 900B.

Figure 9C:
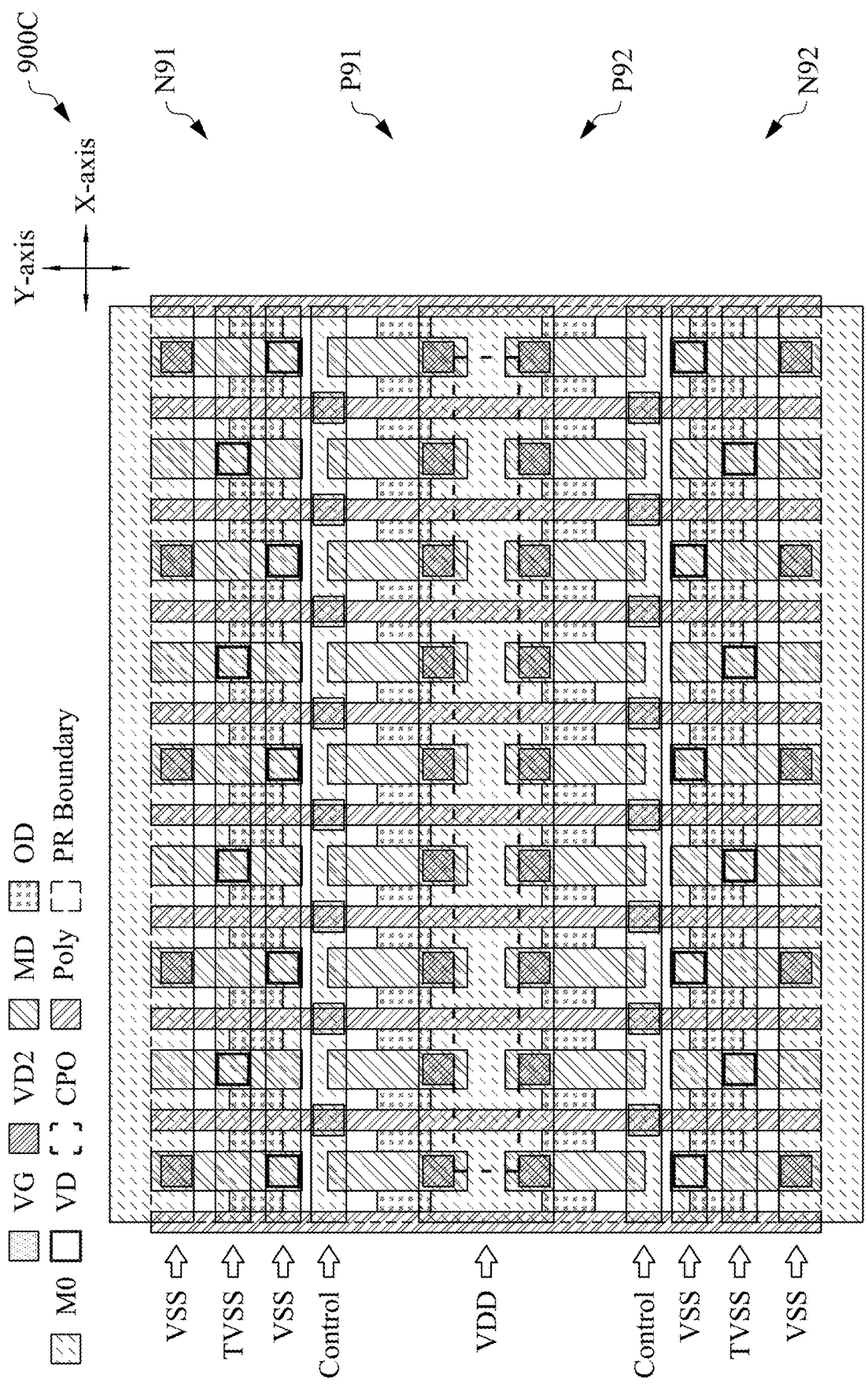
FIG. 9C is a schematic view of a layout diagram of a footer cell, in accordance with some embodiments.

FIG. 9C is a schematic view of a layout diagram of a footer cell 900C, in accordance with some embodiments. In at least one embodiment, the footer cell 900C corresponds to the footer circuit 900B. In at least one embodiment, the footer cell 900C is stored as a standard cell in a standard cell library on a non-transitory computer-readable medium. Corresponding features in FIG. 9B and FIG. 9C are designated by the same reference numerals.

In the example configuration in FIG. 9C, the layout of the footer cell 900C is the same as the layout of the header cell 600B, when PMOS, NMOS, TVDD, VDD, VSS in the header cell 600B are correspondingly replaced with NMOS, PMOS, TVSS, VSS, VDD in footer cell 900C. In at least one embodiment, one or more advantages described herein are achievable in a footer circuit corresponding to the footer cell 900C, and/or an IC device comprising such a footer circuit.

Figure 10A:
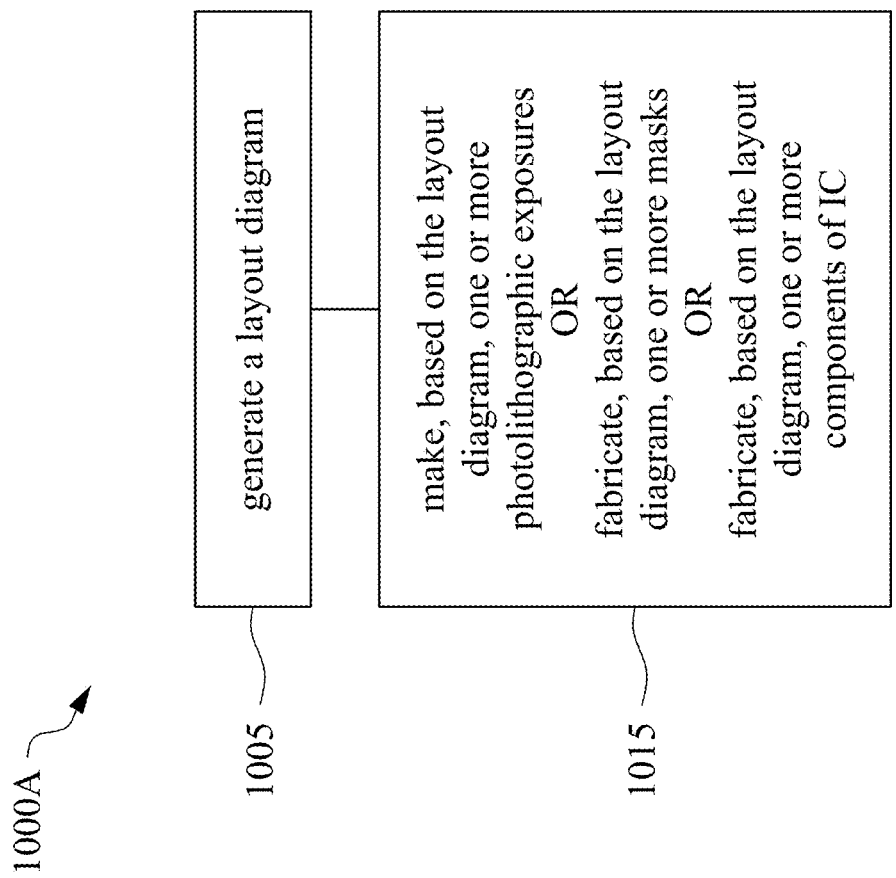
FIGS. 10A-10C are flowcharts of various methods, in accordance with some embodiments.

FIG. 10A is a flowchart of a method 1000A of generating a layout diagram and using the layout diagram to manufacture an IC device, in accordance with some embodiments.

Method 1000A is implementable, for example, using EDA system 1500 (FIG. 15, discussed below) and an integrated circuit (IC) manufacturing system 1600 (FIG. 16, discussed below), in accordance with some embodiments. Regarding method 1000A, examples of the layout diagram include the layout diagrams disclosed herein, or the like. Examples of an IC device to be manufactured according to method 1000A include IC devices with one or more power control circuits including one or more header circuits and/or footer circuits as described herein. In FIG. 10A, method 1000A includes blocks 1005, 1015.

At block 1005, a layout diagram is generated which, among other things, include patterns represent one or more circuit regions, circuitry, circuits or cells as described with respect to FIGS. 4A-4E, 6B, 7A, 7B, 9A, 9C, or the like. An example of an IC device corresponding to a layout diagram generated by block 1005 includes an IC device including one or more power control circuits including header circuits and/or footer circuits as described herein. Block 1005 is discussed in more detail below with respect to FIG. 10B. From block 1005, flow proceeds to block 1015.

At block 1015, based on the layout diagram, at least one of (A) one or more photolithographic exposures are made or (b) one or more semiconductor masks are fabricated or (C) one or more components in a layer of an IC device are fabricated. Block 1015 is discussed in more detail below with respect to FIG. 10C.

Figure 10B:
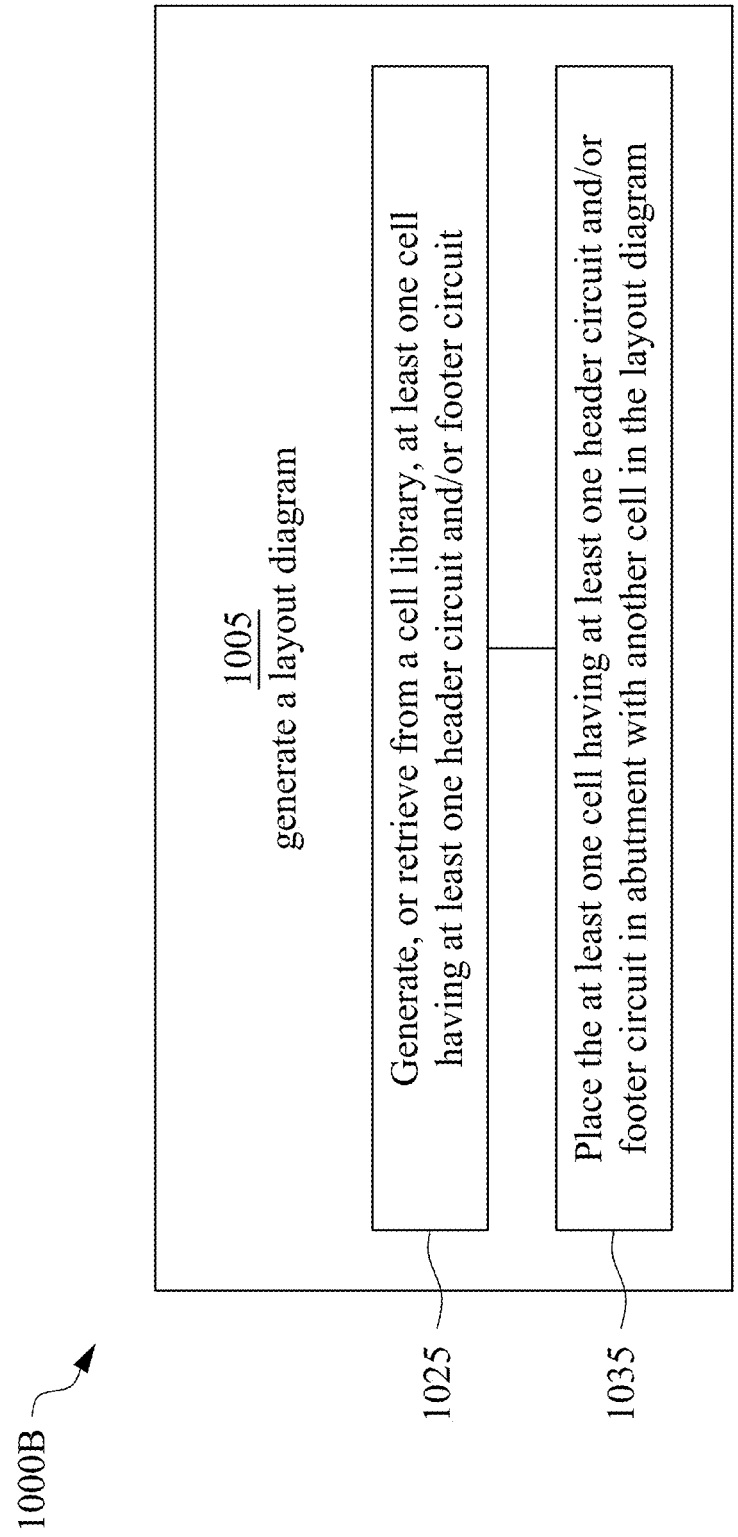

FIG. 10B is a flowchart of a method 1000B of generating a layout diagram, in accordance with some embodiments. More particularly, the flowchart of FIG. 10B shows additional blocks that demonstrates one example of procedures implementable in block 1005 of FIG. 10A, in accordance with one or more embodiments. In FIG. 10B, block 1005 includes blocks 1025, 1035.

At block 1025, at least one cell having at least one header circuit and/or footer circuit is generated, or retrieved from a cell library. For example, a header cell and/or a footer cell corresponding to one or more of the layout diagrams described with respect to FIGS. 4A-4E, 6B, 7A, 7B, 9A, 9C, or the like is generated, or retrieved from a cell library. In at least one embodiment, the header cell and/or footer cell is selected to be retrieved or generated based on $R_{ON}$ required to ensure intended operation of a functional circuit for which power supply is to be provided through the header cell and/or footer cell. Other considerations for retrieving or generating the header cell and/or footer cell include, but are not limited to, cell heights and OD widths of one or more other cells with which the header cell and/or footer cell is to be placed in abutment.

At block 1035, the at least one cell having at least one header circuit and/or footer circuit is placed in abutment with one or more other cells in the layout diagram. In some embodiments, multiple unit header or footer cells are placed in abutment to form a larger header or footer cell, as described with respect to FIGS. 7A-7B. In one or more embodiments the at least one cell having at least one header circuit and/or footer circuit is placed in abutment with other cells constituting the functional circuit for which power supply is to be provided through the header cell and/or footer cell. In at least one embodiment, the generated layout diagram of the IC device is stored on a non-transitory computer-readable medium.

Figure 10C:
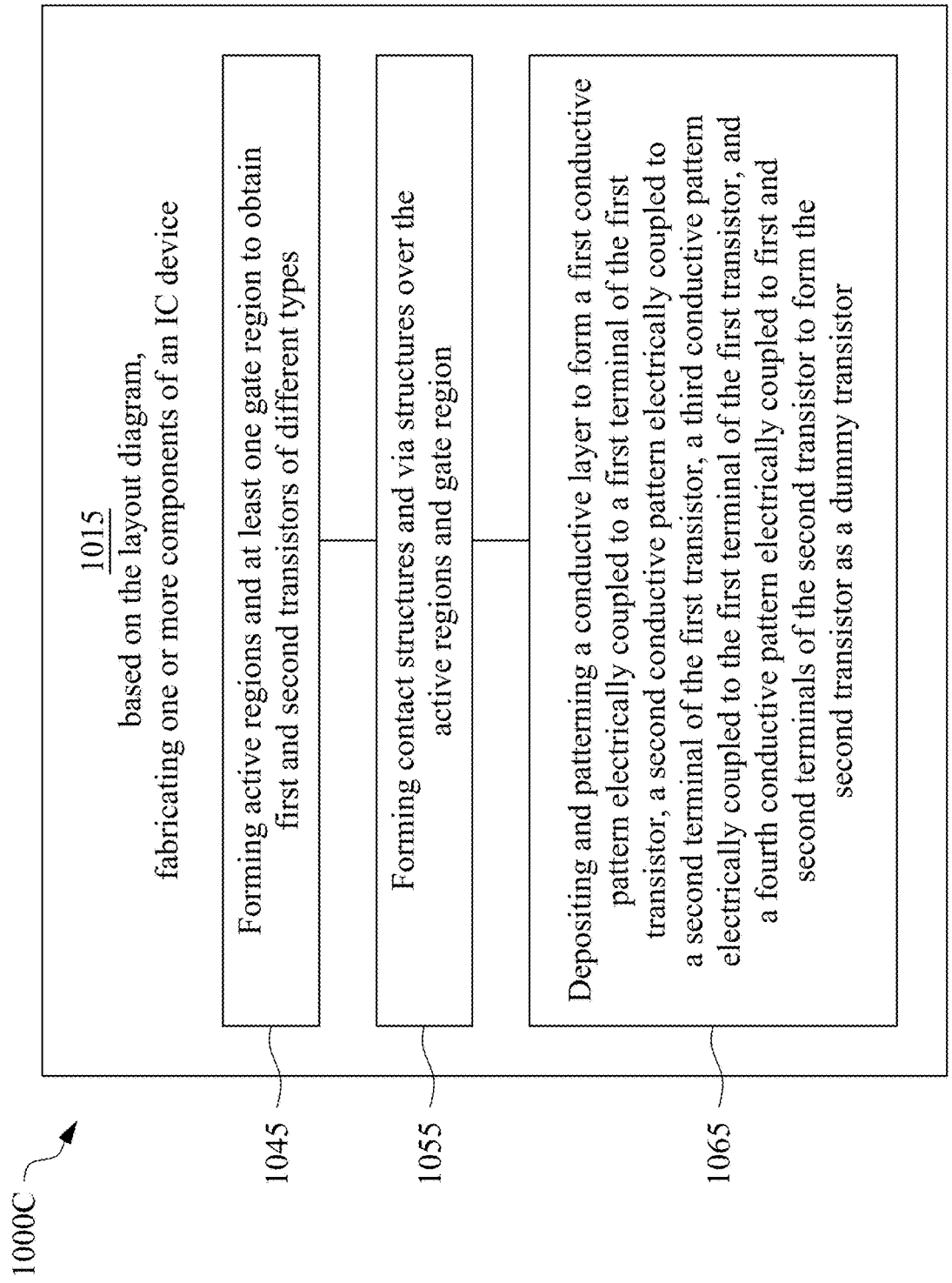

FIG. 10C is a flowchart of a method 1000C of fabricating one or more components of an IC device, based on the layout diagram, in accordance with some embodiments. More particularly, the flowchart of FIG. 10C shows additional blocks that demonstrates one example of procedures implementable in block 1015 of FIG. 10A, in accordance with one or more embodiments. In FIG. 10C, block 1015 includes blocks 1045, 1055, 1065.

At block 1045, active regions and at least one gate region are formed over a substrate to configure first and second transistors of different types. In some embodiments, the active regions, gate regions and/or transistors correspond to one or more of the active regions, gate regions and/or transistors described with respect to FIGS. 2-9C.

An example manufacturing process starts from a substrate, such as the substrate 550 described with respect to FIG. 5A. The substrate comprises, in at least one embodiment, silicon, silicon germanium (SiGe), gallium arsenic, or other suitable semiconductor materials. In some embodiments, the substrate comprises an insulating substrate or a silicon on insulator (SOI) substrate. Active regions are formed in or over the substrate, using one or more masks corresponding to one or more active regions in the layout diagrams described herein. For example, a PMOS active region 401 and an NMOS active region 402 are formed as described with respect to FIG. 4A.

A gate dielectric material layer is deposited over the substrate. Example materials of the gate dielectric material layer include, but are not limited to, a high-k dielectric layer, an interfacial layer, and/or combinations thereof. In some embodiments, the gate dielectric material layer is deposited over the substrate by atomic layer deposition (ALD) or other suitable techniques. A gate electrode layer is deposited over the gate dielectric material layer. Example materials of the gate electrode layer include, but are not limited to, polysilicon, metal, Al, AlTi, Ti, TiN, TaN, Ta, TaC, TaSiN, W, WN, MoN, and/or other suitable conductive materials. In some embodiments, the gate electrode layer is deposited by chemical vapor deposition (CVD), physical vapor deposition (PVD or sputtering), plating, atomic layer deposition (ALD), and/or other suitable processes. A patterning process is then performed, using one or more masks corresponding to one or more gate electrodes in the layout diagrams described herein. As a result, the gate dielectric material layer is patterned in to one or more gate dielectric layers, such as the gate dielectric layers 554, 555, and the gate electrode layer is patterned into at least one gate electrode or gate structure, such as the gate electrode 511 or 512 described with respect to FIG. 5B. The at least one gate electrode extends continuously from the first active region to the second active region, for example, as described with respect to FIG. 4A.

In at least one embodiment, spacers are formed, by deposition and patterning, on opposite sides of each gate electrode. Example materials of the spacers include, but are not limited to, silicon nitride, oxynitride, silicon carbide and other suitable materials. Example deposition processes include, but are not limited to, plasma enhanced chemical vapor deposition (PECVD), low-pressure chemical vapor deposition (LPCVD), sub-atmospheric chemical vapor deposition (SACVD), atomic layer deposition (ALD), or the like. Example patterning processes include, but are not limited to, a wet etch process, a dry etch process, or combinations thereof. Drain/source regions, such as the drain/source regions 551, 552 described with respect to FIG. 5A, are formed in the active regions of the substrate. In at least one embodiment, the drain/source regions are formed by using the gate electrodes and the spacers as a mask. For example, the formation of the drain/source regions is performed by an ion implantation or a diffusion process. Depending on the type of the devices or transistors, the drain/source regions are doped with p-type dopants, such as boron or $BF_2$, n-type dopants, such as phosphorus or arsenic, and/or combinations thereof. As a result, first and second transistors of different types are formed by the at least one gate electrode over the corresponding first and second active regions. In some embodiments, transistors of a functional circuit of the IC device are also formed in the described processes.

At block 1055, MD contact structures and via structures are formed over the active regions and gate region. In some embodiments, the MD contact structures and via structures correspond to one or more MD contact structures and via structures described with respect to FIGS. 4A-4E, 5A-5B, 6B, 9A, 9C.

In an example manufacturing process, a conductive layer, e.g., a metal, is deposited over the substrate with the transistors formed thereon, thereby making electrical connections to the drain/source regions of the transistors. A planarizing process is performed to planarize the conductive layer, resulting in MD contact structures, such as the MD contact structures 421 and 431-434 described with respect to FIGS. 5A, 5B, in electrical contact with the underlying drain/source regions. The planarizing process comprises, for example, a chemical mechanical polish (CMP) process. A dielectric layer is deposited over the substrate with the drain/source contacts formed thereon. The dielectric layer is etched, and the etched portions are filled with a conductive material, such as a metal, to form one or more via structures, such as the VD via structures 450, 454, and 456-459 described with respect to FIGS. 5A, 5B. A planarizing process is then performed. In some embodiments, MD contact structures and VD/VG via structures are also formed over the transistors of the functional circuit in the described processes.

At block 1065, a conductive layer is deposited and patterned to form first-fourth conductive patterns. The first conductive pattern is electrically coupled to a first terminal of the first transistor, the second conductive pattern is electrically coupled to a second terminal of the first transistor, the third conductive pattern is electrically coupled to the first terminal of the first transistor, and the fourth conductive pattern is electrically coupled to first and second terminals of the second transistor to form the second transistor as a dummy transistor. In at least one embodiment, the first-fourth conductive patterns extend along the X-axis.

In an example manufacturing process, an M0 layer including a conductive material, such as a metal, is deposited over the planarized structure and patterned to form various M0 conductive patterns electrically coupled to the corresponding terminals of the corresponding first and second transistors, as described with respect to the M0 conductive patterns 471-475 in FIG. 4A. The M0 conductive patterns 471-475 comprise at least one VDD power rail and at least one VSS power rail. In the example configurations described herein, the conductive patterns are in the M0 layer. However, other metal layers are within the scopes of various embodiments.

In some embodiments, further via layers and/or metal layers are sequentially deposited over the M0 layer and patterned to obtain an interconnect structure, such as the interconnect structure 560 described with respect to FIGS. 5A, 5B. The interconnect structure 560 electrically couples the VDD and VSS power rails formed by the corresponding conductive patterns in the M0 layer to the functional circuit to enable the functional circuit to operate by power supply through the VDD and VSS power rails. In at least one embodiment, one or more advantages described herein are achievable in an IC device manufactured in accordance with the described processes.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

FIG. 11A is a schematic top plan view of a planar transistor 1100, FIG. 11B is a schematic cross-section view of the planar transistor 1100 along line X1-X1 in FIG. 11A, and FIG. 11C is a schematic cross-section view of the planar transistor 1100 along line Y1-Y1 in FIG. 11A, in accordance with some embodiments.

As shown in FIG. 11A, the planar transistor 1100 comprises active regions or source/drain regions 1110, 1120, and a gate region 1130 extending in the Y direction across the source/drain regions 1110, 1120. As shown in FIG. 11B, the source/drain regions 1110, 1120 and the gate region 1130 are formed over a substrate 1140. As shown in FIG. 11C, a channel region 1150 is formed under the gate region 1130 and between the source/drain regions 1110, 1120.

FIG. 12A is a schematic top plan view of a FINFET 1200, FIG. 12B is a schematic cross-section view of the FINFET 1200 along line X2-X2 in FIG. 12A, and FIG. 12C is a schematic cross-section view of the FINFET 1200 along line Y2-Y2 in FIG. 12A, in accordance with some embodiments.

As shown in FIG. 12A, the FINFET 1200 comprises active regions or source/drain regions 1210, 1220, and a gate region 1230 extending in the Y direction across the source/drain regions 1210, 1220. The source/drain regions 1210, 1220 include a plurality of fins 1260 (best seen in FIG. 12B) extending in the X direction. As shown in FIG. 12B, the source/drain regions 1210, 1220 and the gate region 1230 are formed over a substrate 1240, and the fins 1260 are under the gate region 1230. As shown in FIGS. 12B-12C, channel regions 1250 are formed over the fins 1260, under the gate region 1230, and between the source/drain regions 1210, 1220.

FIG. 13A is a schematic top plan view of a nanosheet FET 1300, FIG. 13B is a schematic cross-section view of the nanosheet FET 1300 along line X3-X3 in FIG. 13A, and FIG. 13C is a schematic cross-section view of the nanosheet FET 1300 along line Y3-Y3 in FIG. 13A, in accordance with some embodiments.

As shown in FIG. 13A, the nanosheet FET 1300 comprises active regions or source/drain regions 1310, 1320, and a gate region 1330 extending in the Y direction across the source/drain regions 1310, 1320. The source/drain regions 1310, 1320 include a plurality of nanosheets 1360 (best seen in FIG. 13B). As shown in FIG. 13B, the source/drain regions 1310, 1320 and the gate region 1330 are formed over a substrate 1340. The nanosheets 1360 are surrounded by the gate region 1330. As shown in FIGS. 13B-13C, channel regions 1350 are formed between the nanosheets 1360 and the gate region 1330, and between the source/drain regions 1310, 1320.

FIG. 14A is a schematic top plan view of a nanowire FET 1400, FIG. 14B is a schematic cross-section view of the nanowire FET 1400 along line X4-X4 in FIG. 14A, and FIG. 14C is a schematic cross-section view of the nanowire FET 1400 along line Y4-Y4 in FIG. 14A, in accordance with some embodiments.

As shown in FIG. 14A, the nanowire FET 1400 comprises active regions or source/drain regions 1410, 1420, and a gate region 1430 extending in the Y direction across the source/drain regions 1410, 1420. The source/drain regions 1410, 1420 include a plurality of nanowires 1460 (best seen in FIG. 14B). As shown in FIG. 14B, the source/drain regions 1410, 1420 and the gate region 1430 are formed over a substrate 1440. The nanowires 1460 are surrounded by the gate region 1430. As shown in FIGS. 14B-13C, channel regions 1450 are formed between the nanowires 1460 and the gate region 1430, and between the source/drain regions 1410, 1420.

In some embodiments, at least one method(s) discussed above is performed in whole or in part by at least one EDA system. In some embodiments, an EDA system is usable as part of a design house of an IC manufacturing system discussed below.

Figure 15:
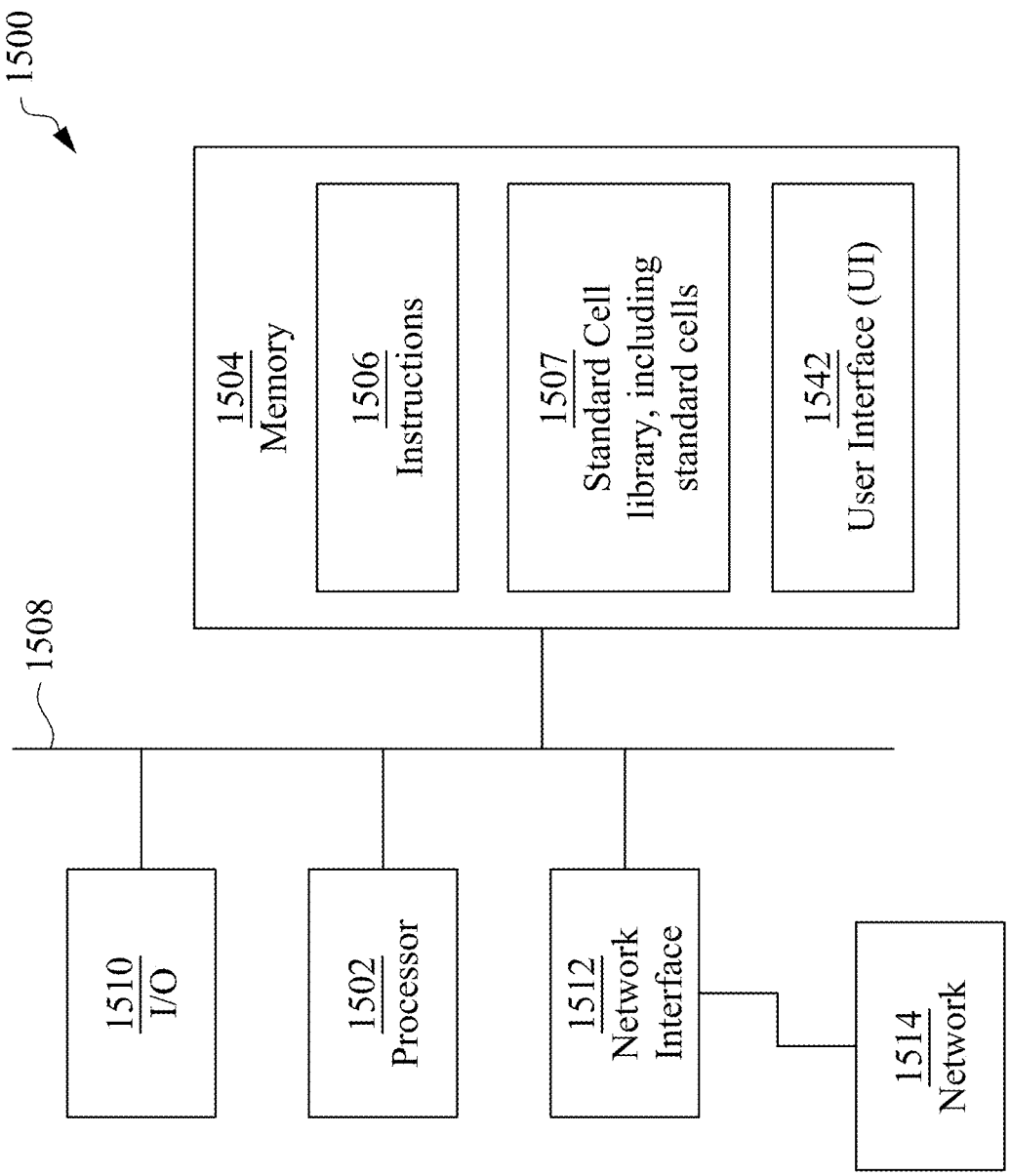
FIG. 15 is a block diagram of an electronic design automation (EDA) system in accordance with some embodiments.

FIG. 15 is a block diagram of an electronic design automation (EDA) system 1500 in accordance with some embodiments.

In some embodiments, EDA system 1500 includes an APR system. Methods described herein of designing layout diagrams represent wire routing arrangements, in accordance with one or more embodiments, are implementable, for example, using EDA system 1500, in accordance with some embodiments.

In some embodiments, EDA system 1500 is a general purpose computing device including a hardware processor 1502 and a non-transitory, computer-readable storage medium 1504. Storage medium 1504, amongst other things, is encoded with, i.e., stores, computer program code 1506, i.e., a set of executable instructions. Execution of instructions 1506 by hardware processor 1502 represents (at least in part) an EDA tool which implements a portion or all of the methods described herein in accordance with one or more embodiments (hereinafter, the noted processes and/or methods).

Processor 1502 is electrically coupled to computer-readable storage medium 1504 via a bus 1508. Processor 1502 is also electrically coupled to an I/O interface 1510 by bus 1508. A network interface 1512 is also electrically connected to processor 1502 via bus 1508. Network interface 1512 is connected to a network 1514, so that processor 1502 and computer-readable storage medium 1504 are capable of connecting to external elements via network 1514. Processor 1502 is configured to execute computer program code 1506 encoded in computer-readable storage medium 1504 in order to cause system 1500 to be usable for performing a portion or all of the noted processes and/or methods. In one or more embodiments, processor 1502 is a central processing unit (CPU), a multi-processor, a distributed processing system, an application specific integrated circuit (ASIC), and/or a suitable processing unit.

In one or more embodiments, computer-readable storage medium 1504 is an electronic, magnetic, optical, electromagnetic, infrared, and/or a semiconductor system (or apparatus or device). For example, computer-readable storage medium 1504 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1504 includes a compact disk-read only memory (CD-ROM), a compact disk-read/write (CD-R/W), and/or a digital video disc (DVD).

In one or more embodiments, storage medium 1504 stores computer program code 1506 configured to cause system 1500 (where such execution represents (at least in part) the EDA tool) to be usable for performing a portion or all of the noted processes and/or methods. In one or more embodiments, storage medium 1504 also stores information which facilitates performing a portion or all of the noted processes and/or methods. In one or more embodiments, storage medium 1504 stores library 1507 of standard cells including such standard cells as disclosed herein.

EDA system 1500 includes I/O interface 1510. I/O interface 1510 is coupled to external circuitry. In one or more embodiments, I/O interface 1510 includes a keyboard, keypad, mouse, trackball, trackpad, touchscreen, and/or cursor direction keys for communicating information and commands to processor 1502.

EDA system 1500 also includes network interface 1512 coupled to processor 1502. Network interface 1512 allows system 1500 to communicate with network 1514, to which one or more other computer systems are connected. Network interface 1512 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1500.

System 1500 is configured to receive information through I/O interface 1510. The information received through I/O interface 1510 includes one or more of instructions, data, design rules, libraries of standard cells, and/or other parameters for processing by processor 1502. The information is transferred to processor 1502 via bus 1508. EDA system 1500 is configured to receive information related to a UI through I/O interface 1510. The information is stored in computer-readable medium 1504 as user interface (UI) 1542.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1500. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 16:
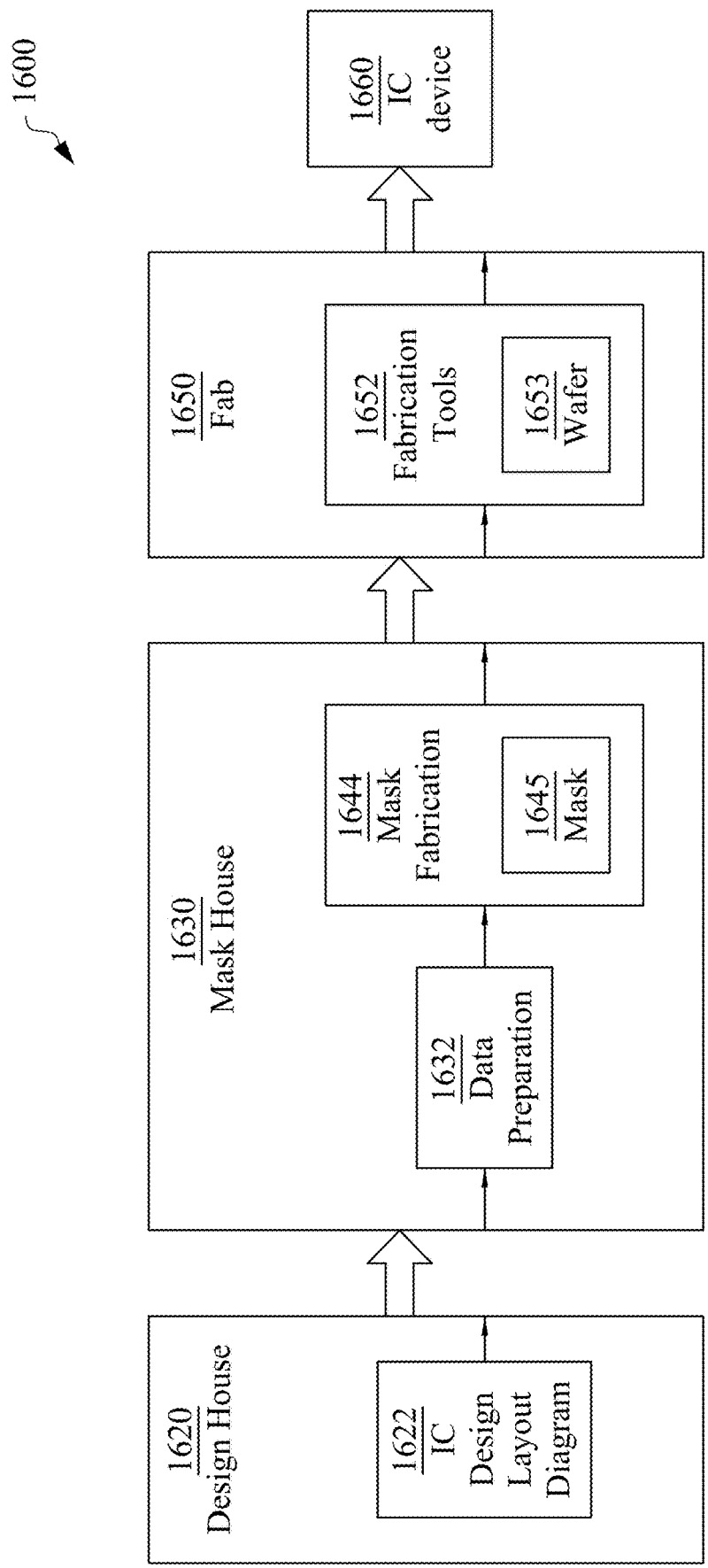
FIG. 16 is a block diagram of an IC device manufacturing system, and an IC manufacturing flow associated therewith, in accordance with some embodiments.

FIG. 16 is a block diagram of an integrated circuit (IC) manufacturing system 1600, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1600.

In FIG. 16, IC manufacturing system 1600 includes entities, such as a design house 1620, a mask house 1630, and an IC manufacturer/fabricator ("fab") 1650, that interact with one another in the design, development, and manufacturing cycles and/or services related to manufacturing an IC device 1660. The entities in system 1600 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1620, mask house 1630, and IC fab 1650 is owned by a single larger company. In some embodiments, two or more of design house 1620, mask house 1630, and IC fab 1650 coexist in a common facility and use common resources.

Design house (or design team) 1620 generates an IC design layout diagram 1622. IC design layout diagram 1622 includes various geometrical patterns designed for an IC device 1660. The geometrical patterns correspond to patterns of metal, oxide, or semiconductor layers that make up the various components of IC device 1660 to be fabricated. The various layers combine to form various IC features. For example, a portion of IC design layout diagram 1622 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1620 implements a proper design procedure to form IC design layout diagram 1622. The design procedure includes one or more of logic design, physical design or place-and-route operation. IC design layout diagram 1622 is presented in one or more data files having information of the geometrical patterns. For example, IC design layout diagram 1622 can be expressed in a GDSII file format or DFII file format.

Mask house 1630 includes data preparation 1632 and mask fabrication 1644. Mask house 1630 uses IC design layout diagram 1622 to manufacture one or more masks 1645 to be used for fabricating the various layers of IC device 1660 according to IC design layout diagram 1622. Mask house 1630 performs mask data preparation 1632, where IC design layout diagram 1622 is translated into a representative data file ("RDF"). Mask data preparation 1632 provides the RDF to mask fabrication 1644. Mask fabrication 1644 includes a mask writer. A mask writer converts the RDF to an image on a substrate, such as a mask (reticle) 1645 or a semiconductor wafer 1653. The design layout diagram 1622 is manipulated by mask data preparation 1632 to comply with particular characteristics of the mask writer and/or requirements of IC fab 1650. In FIG. 16, mask data preparation 1632 and mask fabrication 1644 are illustrated as separate elements. In some embodiments, mask data preparation 1632 and mask fabrication 1644 can be collectively referred to as mask data preparation.

In some embodiments, mask data preparation 1632 includes optical proximity correction (OPC) which uses lithography enhancement techniques to compensate for image errors, such as those that can arise from diffraction, interference, other process effects and the like. OPC adjusts IC design layout diagram 1622. In some embodiments, mask data preparation 1632 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1632 includes a mask rule checker (MRC) that checks the IC design layout diagram 1622 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1622 to compensate for limitations during mask fabrication 1644, which may undo part of the modifications performed by OPC in order to meet mask creation rules.

In some embodiments, mask data preparation 1632 includes lithography process checking (LPC) that simulates processing that will be implemented by IC fab 1650 to fabricate IC device 1660. LPC simulates this processing based on IC design layout diagram 1622 to create a simulated manufactured device, such as IC device 1660. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1622.

It should be understood that the above description of mask data preparation 1632 has been simplified for the purposes of clarity. In some embodiments, data preparation 1632 includes additional features such as a logic operation (LOP) to modify the IC design layout diagram 1622 according to manufacturing rules. Additionally, the processes applied to IC design layout diagram 1622 during data preparation 1632 may be executed in a variety of different orders.

After mask data preparation 1632 and during mask fabrication 1644, a mask 1645 or a group of masks 1645 are fabricated based on the modified IC design layout diagram 1622. In some embodiments, mask fabrication 1644 includes performing one or more lithographic exposures based on IC design layout diagram 1622. In some embodiments, an electron-beam (e-beam) or a mechanism of multiple e-beams is used to form a pattern on a mask (photomask or reticle) 1645 based on the modified IC design layout diagram 1622. Mask 1645 can be formed in various technologies. In some embodiments, mask 1645 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1645 includes a transparent substrate (e.g., fused quartz) and an opaque material (e.g., chromium) coated in the opaque regions of the binary mask. In another example, mask 1645 is formed using a phase shift technology. In a phase shift mask (PSM) version of mask 1645, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1644 is used in a variety of processes. For example, such a mask(s) is used in an ion implantation process to form various doped regions in semiconductor wafer 1653, in an etching process to form various etching regions in semiconductor wafer 1653, and/or in other suitable processes.

IC fab 1650 is an IC fabrication business that includes one or more manufacturing facilities for the fabrication of a variety of different IC products. In some embodiments, IC Fab 1650 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1650 includes fabrication tools 1652 configured to execute various manufacturing operations on semiconductor wafer 1653 such that IC device 1660 is fabricated in accordance with the mask(s), e.g., mask 1645. In various embodiments, fabrication tools 1652 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1650 uses mask(s) 1645 fabricated by mask house 1630 to fabricate IC device 1660. Thus, IC fab 1650 at least indirectly uses IC design layout diagram 1622 to fabricate IC device 1660. In some embodiments, semiconductor wafer 1653 is fabricated by IC fab 1650 using mask(s) 1645 to form IC device 1660. In some embodiments, the IC fabrication includes performing one or more lithographic exposures based at least indirectly on IC design layout diagram 1622. Semiconductor wafer 1653 includes a silicon substrate or other proper substrate having material layers formed thereon. Semiconductor wafer 1653 further includes one or more of various doped regions, dielectric features, multi-level interconnects, and the like (formed at subsequent manufacturing steps).

Details regarding an integrated circuit (IC) manufacturing system (e.g., system 1600 of FIG. 16), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, an integrated circuit (IC) device comprises a functional circuit and a power control circuit. The functional circuit is electrically coupled to a first power supply node, and operable by a first power supply voltage on the first power supply node. The power control circuit comprises a first transistor of a first type, and a second transistor of a second type different from the first type. The first transistor comprises a gate terminal configured to receive a control signal, a first terminal electrically coupled to the first power supply node, and a second terminal electrically coupled to a second power supply node. The second transistor comprises a gate terminal configured to receive the control signal, and first and second terminals configured to receive a predetermined voltage. The first transistor is configured to, in response to the control signal, connect or disconnect the first and second power supply nodes to provide or cutoff power supply to the functional circuit.

In some embodiments, an integrated circuit (IC) device comprises a first active region of a first semiconductor type, a second active region of a second semiconductor type different from the first semiconductor type, a plurality of gate regions extending over and across the first and second active regions, a plurality of contact structures over and in electrical contact with corresponding portions of the first and second active regions, and a conductive layer over the plurality of gate regions and the plurality of contact structures. The conductive layer comprises a first conductive pattern electrically coupling a first set of the contact structures over the first active region together, a second conductive pattern electrically coupling a second set of the contact structures over the first active region together, a third conductive pattern electrically coupling the plurality of gate regions together, and a fourth conductive pattern electrically coupling the contact structures over the second active region together.

In some embodiments, a method comprises forming, over a substrate, a first active region of a first semiconductor type and a second active region of a second semiconductor type different from the first semiconductor type. The first and second active regions extend along a first axis. The method further comprises forming a gate structure over the first and second active regions. The gate structure extends continuously from the first active region to the second active region along a second axis transverse to the first axis. The gate structure and the first active region are configured as a first transistor of a first type. The gate structure and the second active region are configured as a second transistor of a second type different from the first type. The method further comprises depositing a conductive layer over the gate structure and the first and second active regions, and patterning the conductive layer into a plurality of conductive patterns extending along the first axis. The plurality of conductive patterns comprises a first conductive pattern electrically coupled to a first terminal of the first transistor, a second conductive pattern electrically coupled to a second terminal of the first transistor, a third conductive pattern electrically coupled to the first terminal of the first transistor, and a fourth conductive pattern electrically coupled to first and second terminals of the second transistor to form the second transistor as a dummy transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device, comprising:
a functional circuit electrically coupled to a first power supply node, and operable by a first power supply voltage on the first power supply node; and
a power control circuit comprising a first transistor of a first type, and a second transistor of a second type different from the first type,
wherein
the first transistor comprises:
a gate terminal configured to receive a control signal,
a first terminal electrically coupled to the first power supply node, and
a second terminal electrically coupled to a second power supply node,
the second transistor comprises:
a gate terminal configured to receive the control signal, and
first and second terminals configured to receive a predetermined voltage, and
the first transistor is configured to, in response to the control signal, connect or disconnect the first and second power supply nodes to provide or cutoff power supply to the functional circuit.

2. The IC device of claim 1, wherein
the predetermined voltage is one of
the control signal,
the first power supply voltage of the first power supply node,
a second power supply voltage of the second power supply node,
a third power supply voltage different from the first power supply voltage, the functional circuit operable by the first power supply voltage and the third power supply voltage, or
a voltage other than the control signal and the first through third power supply voltages.

3. The IC device of claim 1, wherein
the power control circuit is a header circuit,
the first transistor is a P-type transistor, and
the second transistor is an N-type transistor.

4. The IC device of claim 1, wherein
the power control circuit is a footer circuit,
the first transistor is an N-type transistor, and
the second transistor is a P-type transistor.

5. The IC device of claim 1, wherein
in response to the first transistor being in a turned OFF state, the first power supply node is disconnected from the second power supply node and is floating.

6. An integrated circuit (IC) device, comprising:
a first active region of a first semiconductor type;
a second active region of a second semiconductor type, the second semiconductor type different from the first semiconductor type;
a plurality of gate regions extending over and across the first and second active regions;
a plurality of contact structures over and in electrical contact with corresponding portions of the first and second active regions; and
a conductive layer over the plurality of gate regions and the plurality of contact structures, the conductive layer comprising:
a first conductive pattern electrically coupling a first set of the contact structures over the first active region together,
a second conductive pattern electrically coupling a second set of the contact structures over the first active region together,
a third conductive pattern electrically coupling the plurality of gate regions together, and
a fourth conductive pattern electrically coupling the contact structures over the second active region together.

7. The IC device of claim 6, wherein
the plurality of gate regions and the first active region are configured as a first transistor of a first type, and
the plurality of gate regions and the second active region are configured as a second transistor of a second type different from the first type.

8. The IC device of claim 7, wherein
the first conductive pattern is configured as a first power rail of a functional circuit operable by a first power supply voltage on the first power rail,
the second conductive pattern is configured as a second power rail, and
the first transistor is configured to, in response to a control signal on the third conductive pattern, connect or disconnect the first and second power rails.

9. The IC device of claim 8, wherein
the conductive layer further comprises:
a fifth conductive pattern electrically coupling the first set of the contact structures together.

10. The IC device of claim 9, wherein
the contact structures in the first set are arranged alternatingly with the contact structures in the second set along a first axis, and
the second conductive pattern is arranged between the first conductive pattern and the fifth conductive pattern along a second axis transverse to the first axis.

11. The IC device of claim 9, wherein
the conductive layer further comprises:
a sixth conductive pattern electrically coupling the second set of the contact structures together.

12. The IC device of claim 11, wherein
the contact structures in the first set are arranged alternatingly with the contact structures in the second set along a first axis, and
the second and sixth conductive patterns are arranged alternatingly with the first and fifth conductive patterns along a second axis transverse to the first axis.

13. The IC device of claim 11, wherein
the contact structures of the second set extend continuously from the first active region to the second active region to form a corresponding set of the contact structures over the second active region.

14. The IC device of claim 9, wherein the contact structures of the first set extend continuously from the first active region to the second active region to form a corresponding set of the contact structures over the second active region.

15. The IC device of claim 9, wherein the third conductive pattern and the fourth conductive pattern are electrically coupled together.

16. The IC device of claim 9, wherein the fourth conductive pattern is either configured to receive a predetermined voltage, or configured as a third power rail, and
the predetermined voltage is a voltage other than all of the control signal,
the first power supply voltage of the first power rail,
a second power supply voltage of the second power rail, and
a third power supply voltage of the third power rail, the third power supply voltage different from the first power supply voltage, the functional circuit operable by the first power supply voltage and the third power supply voltage.

17. The IC device of claim 6, further comprising:
a third active region of the first semiconductor type;
a fourth active region of the second semiconductor type, wherein
the first through fourth active regions extend along a first axis, and
the second and fourth active regions are arranged between the first and third active regions along a second axis transverse to the first axis;
a plurality of further gate regions extending over and across the third and fourth active regions, the plurality of further gate regions correspondingly aligned with the plurality of gate regions; and
a plurality of further contact structures over and in electrical contact with corresponding portions of the third and fourth active regions,
wherein
the conductive layer further comprises:
a fifth conductive pattern electrically coupling a third set of the further contact structures over the third active region together,
a sixth conductive pattern electrically coupling a fourth set of the further contact structures over the third active region together,
a seventh conductive pattern electrically coupling the plurality of further gate regions together, and
the fourth conductive pattern further electrically couples the further contact structures over the fourth active region together.

18. The IC device of claim 6, wherein the conductive layer is an M zero (M0) layer.

19. A method, comprising:
forming, over a substrate, a first active region of a first semiconductor type and a second active region of a second semiconductor type different from the first semiconductor type, the first and second active regions extending along a first axis;
forming a gate structure over the first and second active regions, the gate structure extending continuously from the first active region to the second active region along a second axis transverse to the first axis, wherein
the gate structure and the first active region are configured as a first transistor of a first type, and
the gate structure and the second active region are configured as a second transistor of a second type different from the first type; and
depositing a conductive layer over the gate structure and the first and second active regions, and patterning the conductive layer into a plurality of conductive patterns extending along the first axis, the plurality of conductive patterns comprising
a first conductive pattern electrically coupled to a first terminal of the first transistor,
a second conductive pattern electrically coupled to a second terminal of the first transistor,
a third conductive pattern electrically coupled to the first terminal of the first transistor, and
a fourth conductive pattern electrically coupled to first and second terminals of the second transistor to form the second transistor as a dummy transistor.

20. The method of claim 19, wherein the plurality of conductive patterns further comprises:
a fifth conductive pattern electrically coupled to the gate structure, and
the fifth conductive pattern is
over the second active region, or
over a space between the first and second active regions.

* * * * *